United States Patent [19]
Hashimoto et al.

[11] Patent Number: 6,107,562
[45] Date of Patent: Aug. 22, 2000

[54] SEMICONDUCTOR THIN FILM, METHOD FOR MANUFACTURING THE SAME, AND SOLAR CELL USING THE SAME

[75] Inventors: Yasuhiro Hashimoto, Kyoto; Takayuki Negami, Osaka; Shigeo Hayashi, Kyoto; Takahiro Wada, Osaka, all of Japan

[73] Assignee: Matsushita Electric Industrial Co., Ltd., Osaka, Japan

[21] Appl. No.: 09/271,782

[22] Filed: Mar. 18, 1999

[30] Foreign Application Priority Data

Mar. 24, 1998 [JP] Japan .................................. 10-075548
Mar. 24, 1998 [JP] Japan .................................. 10-075549

[51] Int. Cl.$^7$ .............................. H01L 31/04; H01L 31/06
[52] U.S. Cl. .......................... 136/252; 136/260; 136/262; 136/264; 136/265; 257/184; 257/183; 257/200; 257/201; 257/461; 428/620; 427/74; 427/76
[58] Field of Search .................................. 136/260, 262, 136/264, 265, 252; 257/184, 183, 200, 201, 461; 438/57, 84, 94, 95, 479, 542; 428/620; 427/74, 76

[56] References Cited

U.S. PATENT DOCUMENTS

| | | | |
|---|---|---|---|
| 3,978,510 | 8/1976 | Kasper et al. | 136/260 |
| 4,335,266 | 6/1982 | Mickelsen et al. . | |
| 4,612,411 | 9/1986 | Wieting et al. | 136/265 |
| 4,687,881 | 8/1987 | Goslowsky et al. . | |
| 5,112,410 | 5/1992 | Chen | 136/260 |
| 5,137,835 | 8/1992 | Karg . | |
| 5,141,564 | 8/1992 | Chen et al. . | |
| 5,356,839 | 10/1994 | Tuttle et al. . | |
| 5,422,304 | 6/1995 | Kohiki et al. | 136/265 |
| 5,441,897 | 8/1995 | Noufi et al. . | |
| 5,578,503 | 11/1996 | Karg et al. . | |
| 5,626,688 | 5/1997 | Probst et al. . | |
| 5,843,341 | 12/1998 | Orita et al. | 252/519.1 |
| 5,858,121 | 1/1999 | Wada et al. . | |
| 5,948,176 | 9/1999 | Ramanathan et al. | 136/264 |

FOREIGN PATENT DOCUMENTS

| | | |
|---|---|---|
| 1-28967 | 1/1989 | Japan . |
| 3-64973 | 3/1991 | Japan . |
| 4-132233 | 5/1992 | Japan . |
| 5-63224 | 3/1993 | Japan . |
| 6-45248 | 2/1994 | Japan . |
| 8-195501 | 7/1996 | Japan . |
| WO 94/07269 | 3/1994 | WIPO . |

OTHER PUBLICATIONS

J. Shewchun et al. "The Application of Pentenary Alloy Compounds of the . . . Variety to Photovoltaic Solar Energy Conversion" *14th IEEE Photovoltaic Specialists Conference*, pp. 650–655, May 1980.

M.L. Fearheiley "The Phase Relations in the Cu, In, Se System and the Growth of CuInSe$_2$ Single Crystals" *Solar Cells*, vol. 16, pp. 91–100, Jan. 1986.

H. Hallak et al. "Composition and substrate effects on the structure of thin–film CuGaSe$_2$." *Applied Physics Letters*, vol. 55, No. 10, pp. 981–983, Sep. 1989.

H. Neumann et al. "Relation Between Electrical Properties and Composition in CuInSe$_2$ Single Crystals" *Solar Cells*, vol. 28, No. 4, pp. 301–313, May 1990.

A. Rockett et al. "CuInSe$_2$ for photovoltaic applications" *J. Appl. Phys.*, vol. 70, No. 7, pp. R81–R97, Oct. 1991.

(List continued on next page.)

*Primary Examiner*—Alan Diamond
*Attorney, Agent, or Firm*—Merchant & Gould P.C.

[57] ABSTRACT

A semiconductor thin film comprises an n-type compound semiconductor layer including at least one element from each of groups Ib, IIIb, VIb and II. A solar cell using this semiconductor thin film comprises a substrate and a rear electrode, a p-type compound semiconductor layer, an n-type compound semiconductor layer, an n-type semiconductor layer, a window layer, and a transparent conductive film, formed in this order on the substrate. The n-type compound semiconductor layer including at least one element from each of groups Ib, IIIb, VIb and II has a high carrier density.

29 Claims, 18 Drawing Sheets

OTHER PUBLICATIONS

C.L. Jensen et al. "The Role of Gallium in $CuInSe_2$ Solar Cells Fabricated by a Two–Stage Method" *Proceedings of the Photovoltaic Specialists Conference*, pp. 577–580, May 1993.

Hans–W. Schock "$CuInSe_2$ and Other Chalcopyrite–Based Solar Cells" *MRS Bulletin*, vol. 18, No. 10, pp. 42–44, Oct. 1993.

A.M. Gabor et al. "High Efficiency Polycrystalline Cu(In, Ga)$Se_2$–Based Solar Cells" *American Institute of Physics*, pp. 59–66, 1994 (month unknown).

J.R. Tuttle et al. "Structure, chemistry, and growth mechanisms of photovoltaic quality thin–film Cu(In,Ga)$Se_2$ grown from a mixed phase precursor" *J. Appl. Phys.*, vol. 77, No. 1, pp. 153–161, Jan. 1995.

M. Hornung et al. "Growth of bulk $Cu_{0.85}In_{1.05}Se_2$ and characterization on a micro scale" *Journal of Crystal Growth*, vol. 154, pp. 315–321, Sep. 1995.

SEMICONDUCTOR THIN FILM, METHOD FOR MANUFACTURING THE SAME, AND SOLAR CELL USING THE SAME

FIELD OF THE INVENTION

The present invention relates to a semiconductor thin film, a method for manufacturing the same, and a solar cell using the semiconductor thin film. In particular, the invention relates to a semiconductor thin film including at least one element from each of groups Ib, IIIb, and VIb.

BACKGROUND OF THE INVENTION $CuInSe_2$ (CIS) and $Cu(In, Ga)Se_2$ (CIGS) are compound semiconductors (of chalcopyrite structure) comprising at least one element from each of groups Ib, IIIb, and VIb. Thin-film solar cells using these semiconductors for the light-absorption layer have been reported to achieve a high energy conversion rate, which does not deteriorate due to irradiation. Throughout this specification, "groups Ib, Ib, VIb, II, IIa, and IIb" refer to "groups 1B, 3B, 6B, 2, 2A, and 2B" of the periodic table of elements according to the old IUPAC recommendation before 1985. Thus, group IIIb refers to the group B, Al, Ga, etc.

Conventional CIS or CIGS solar cells are generally made by forming an n-type semiconductor layer by chemical bath deposition on a CIS film or a CIGS film formed by vapor deposition or selenization.

FIG. 18 illustrates an example of a conventional CIS or CIGS solar cell. A conventional solar cell 1 comprises a substrate 2, a rear electrode 3 deposited on the substrate 2, a p-type compound semiconductor layer 4 made of a CIS film or a CIGS film, an n-type semiconductor layer 5, a ZnO film 6, and a transparent conductive film 7. The n-type semiconductor layer 5 is made of Zn(O, OH, S).

In the conventional solar cell 1, a pn-junction is formed between the p-type compound semiconductor layer 4 made of a CIS film or a CIGS film and the n-type semiconductor layer 5. This pn-junction has a large influence on the energy conversion ratio. Several methods have been proposed for forming the n-type semiconductor layer 5 in a manner that improves the junction formed between the p-type compound semiconductor layer 4 and the n-type semiconductor layer 5.

However, one of the mains problems in such a conventional solar cell 1 is that the structures of the p-type compound semiconductor layer 4 and the n-type semiconductor layer 5 are completely different, so that defects near the junction are abundant.

SUMMARY OF THE INVENTION

It is an object of the present invention to provide a semiconductor thin film comprising an n-type compound semiconductor layer that can form a favorable junction with a CIS film or a CIGS film, a method for manufacturing the same, and a solar cell using the same.

To achieve these objects, a semiconductor thin film in accordance with the present invention comprises an n-type compound semiconductor layer including at least one element from each of groups Ib, IIIb, VIb and II. (Throughout this specification, "a group Ib element" means "at least one element of group Ib", and "a group II element" means "at least one element selected from the elements of the groups IIa and IIb".) With this configuration, a semiconductor thin film can be obtained that forms a favorable pn-junction with a CIS film or a CIGS film.

It is preferable that the semiconductor thin film further comprises a p-type compound semiconductor layer adjacent to the n-type compound semiconductor layer, the p-type compound semiconductor layer including at least one element from each of groups Ib, IIIb, and VIb. With this configuration, a semiconductor thin film having a pn-junction with few defects at the junction interface can be obtained.

It is preferable that the group Ib elements consist of Cu, the group IIIb elements include at least one element selected from the group consisting of In and Ga, and the group VIb elements include at least one element selected from the group consisting of Se and S. If the group Ib elements, the group IIIb elements, and the group VIb elements include these elements, a semiconductor thin film that is suitable for a solar cell can be obtained.

It is preferable that the group II elements includes at least one element selected from the group consisting of Mg, Zn and Cd. By using at least one element selected from the group consisting of Mg, Zn and Cd for the group II elements, an n-type compound semiconductor thin film with good characteristics can be obtained.

It is preferable that a proportion of the elements of group Ib, group IIIb, and group VIb in the n-type compound semiconductor layer is X:Y:Z, wherein $0.05 \leq X \leq 0.2$; $0.25 \leq Y \leq 0.4$; and $0.45 \leq Z \leq 0.65$. If the n-type compound semiconductor layer has this composition ratio, the manufacture of the semiconductor thin film becomes easy.

It is preferable that a proportion of the elements of group Ib, group IIIb, and group VIb in the p-type compound semiconductor layer is U:V:W, wherein $0.15 \leq U \leq 0.35$; $0.15 \leq V \leq 0.35$; and $0.4 \leq W \leq 0.6$. If the p-type compound semiconductor layer has this composition ratio, the manufacture of the semiconductor thin film becomes easy.

It is preferable that the semiconductor thin film further comprises an n-type semiconductor layer formed on the n-type compound semiconductor layer. With this configuration, a semiconductor thin film that is suitable for a solar cell can be obtained.

It is preferable that the n-type semiconductor comprises at least one semiconductor layer selected from the group consisting of ZnO, Zn(O, OH), Zn(O, OH, S), and $ZnIn_xSe_y$. By Using such a semiconductor layer for the n-type semiconductor layer, a semiconductor thin film that is suitable for a solar cell can be obtained.

A first method for manufacturing a semiconductor thin film comprises (a) forming a first compound semiconductor layer including at least one element from each of groups Ib, IIIb, and VIb; and (b) forming an n-type compound semiconductor layer including at least one element from each of groups Ib, IIIb, VIb and II by introducing a group II element into the first compound semiconductor layer. This first manufacturing method facilitates forming an n-type compound semiconductor layer comprising at least one element from each of groups Ib, IIIb, VIb, and II.

In this first method, it is preferable that the group Ib elements consists of Cu, the group IIIb elements include at least one element selected from the group consisting of In and Ga, and the group VIb elements include at least one element selected from the group consisting of Se and S. If the group Ib elements, the group IIIb elements, and the group VIb elements include these elements, a semiconductor thin film that is suitable for a solar cell can be obtained.

In the first method, it is preferable that the group II element includes at least one element selected from the group consisting of Mg, Zn and Cd. By using at least one element selected from the group consisting of Mg, Zn and Cd for the group II elements, an n-type compound semiconductor thin film with good characteristics can be manufactured.

In the first method, it is preferable that step (a) comprises forming a p-type compound semiconductor layer including at least one element from each of the groups Ib, IIIb, and VIb; and forming the first compound semiconductor layer on the p-type compound semiconductor layer. When step (a) comprises these steps, a semiconductor thin film that comprises a p-type compound semiconductor layer including at least one element from each of groups Ib, IIIB, and VIb, and an n-type compound semiconductor layer including at least one element from each of groups Ib, IIIB, VIb, and II can be manufactured easily.

In the first method, it is preferable that a proportion of the elements of group Ib, group IIIB, and group VIb in the first compound semiconductor layer is X: Y: Z, with $0.05 \leq X \leq 0.2$; $0.25 \leq Y \leq 0.4$; and $0.45 \leq Z \leq 0.65$; and a proportion of the elements of group Ib, group IIIb, and group VIb in the p-type compound semiconductor layer is U: V: W, with $0.15 \leq U \leq 0.35$; $0.15 \leq V \leq 0.35$; and $0.4 \leq W \leq 0.6$. When the first compound semiconductor layer and the p-type compound semiconductor layer have this configuration, the group II element can be introduced principally into the first compound semiconductor layer.

It is preferable that the first method further comprises (c) forming an n-type semiconductor layer on the n-type compound semiconductor layer. By including such a third step, a semiconductor thin film that is suitable for a solar cell can be manufactured.

In the first method, it is preferable that the n-type semiconductor layer comprises at least one semiconductor selected from the group consisting of ZnO, Zn(O, OH), Zn(O, OH, S), and $ZnIn_xSe_y$. By including such a semiconductor layer in the n-type semiconductor layer, a semiconductor thin film that is particularly suitable for a solar cell can be manufactured.

In the first method, it is preferable that in step (b), the group II element is introduced into the first compound semiconductor layer by contacting the first compound semiconductor layer with a solution that comprises ions of the group II element. This facilitates the introduction of the group II element into the first compound semiconductor layer.

In the first method, it is preferable that the solution comprises at least one solute selected from the group consisting of the halides, acetates, nitrates and sulfates of group II elements. When the solution contains such a solute, ions of the group II element are generated in the solution, and the group II element can be introduced easily into the first compound semiconductor layer.

In the first method, it is preferable that the solution comprises ammonia. When the solution comprises ammonia, it becomes easy to introduce the group II element into the first compound semiconductor layer.

In the first method, it is preferable that the temperature of the solution is 10° C. to 100° C. When the temperature of the solution is at least 10° C., the group II element can be introduced into the compound semiconductor thin film with high efficiency. When the temperature of the solution is at most 100° C., damage of the compound semiconductor thin film can be avoided.

In the first method, it is preferable that the pH-value of the solution is 10 to 12. When the pH-value of the solution is 10 to 12, the group II element can be introduced into the compound semiconductor thin film with high efficiency.

It is preferable that the first method further comprises (d) heating the n-type compound semiconductor layer after step (b). By treating the n-type compound semiconductor layer with heat after step (b), the crystallinity of the compound semiconductor thin film can be improved.

In the first method, it is preferable that the step (d) is performed either in a gas atmosphere consisting of at least one gas selected from the group consisting of nitrogen, hydrogen sulfide, and argon, or in a vacuum. When the heating is performed in such an atmosphere, annealing is possible while avoiding oxidation.

In the first method, it is preferable that step (d) is performed at a temperature of 100° C. to 600° C. When the heat-treatment is performed at a temperature of at least 100° C., the crystallinity of the compound semiconductor thin film can be raised effectively. Furthermore, when the heat-treatment is performed at a temperature of at most 600° C., deformation of the substrate can be avoided.

In the first method, it is preferable that step (b) is performed by thermal diffusion of the group II element after forming a metal thin film made of the group II element on the first compound semiconductor layer. Using thermal diffusion facilitates the introduction of an element of group II into the compound semiconductor thin film.

A second method for manufacturing a semiconductor thin film comprises forming an n-type compound semiconductor layer including at least one element from each of groups Ib, IIIb, VIb and II by simultaneously depositing the at least one element from each of groups Ib, IIIb, VIb and II. This second method facilitates manufacturing an n-type semiconductor layer including at least one element from each of groups Ib, IIIb, VIb and II.

In the second method, it is preferable that at least one element from each of groups Ib, IIIb, VIb and II are deposited by at least one method selected from vapor deposition and sputtering. This facilitates the manufacturing an n-type semiconductor layer including at least one element from each of groups Ib, IIIb, VIb and II.

In the second method, it is preferable that at least one group Ib element consists of Cu, at least one group IIIb element includes at least one element selected from the group consisting of In and Ga, and at least one group VIb element includes at least one element selected from the group consisting of Se and S. If the group Ib elements, the group IIIb elements, and the group VIb elements include these elements, a semiconductor thin film that is suitable for a solar cell can be obtained.

In the second method, it is preferable that at least one group II element includes at least one element selected from the group consisting of Mg, Zn and Cd. By using at least one element selected from the group consisting of Mg, Zn and Cd for the group II elements, an n-type compound semiconductor thin film with good characteristics can be obtained.

It is preferable that a solar cell comprises one of the semiconductor thin films, because then a solar cell with superior characteristics can be obtained.

BRIEF DESCRIPTION OF THE DRAWINGS

FIG. 12 illustrates the measured photoluminescence of a semiconductor thin film of the present invention.

DESCRIPTION OF THE PREFERRED EMBODIMENTS

The following is an explanation of the preferred embodiments of the present invention, with reference to the accompanying drawings.

First Embodiment

The following describes a first embodiment of the present invention referring to a non-limiting example of a semiconductor thin film comprising an n-type compound semiconductor layer including at least one element from each of groups Ib, IIIb, and VIb.

Figure 1:
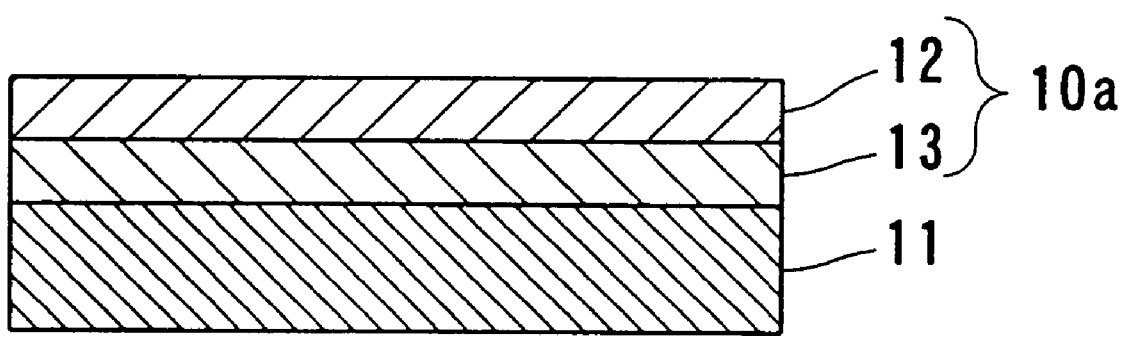
FIG. 1 is a cross-sectional view showing a semiconductor thin film in accordance with the present invention.
Figure 2:
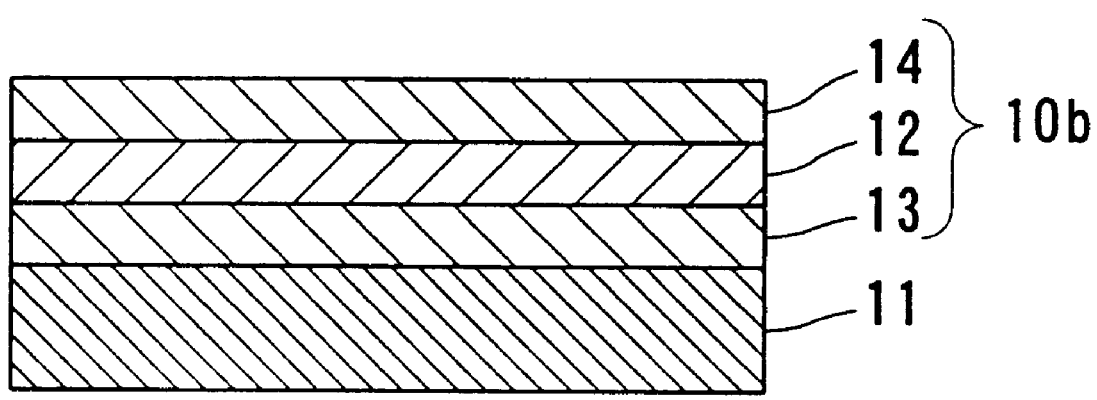
FIG. 2 is a cross-sectional view showing another semiconductor thin film in accordance with the present invention.

As illustrated in FIG. 1, a semiconductor thin film 10a in a first embodiment of the present invention comprises a p-type compound semiconductor layer 13 formed on a substrate 11, and an n-type compound semiconductor layer 12 formed on the p-type compound semiconductor layer 13. The semiconductor thin film of the present invention can have other configurations, as long as it includes the n-type compound semiconductor layer 12. For example, a semiconductor thin film in accordance with the present invention also can include a p-type compound semiconductor layer 13 deposited on a substrate 11, an n-type compound semiconductor layer 12, and an n-type semiconductor layer 14, as shown in FIG. 2. (This structure is referred to as "semiconductor thin film 10b" in the following.)

The substrate 11 can be, for example, a glass substrate, a stainless steel substrate, a semiconductor substrate, or an organic resin film. If necessary, a semiconductor thin film or a metal thin film can be formed on the surface of the substrate. A polysulfite film (for example Kapton; trademark of DuPont Ind.) or a polyimide film can be used for the organic resin film.

The n-type compound semiconductor layer 12 includes at least one element from each of groups Ib, IIIb, VIb, and II. Compound semiconductor layers made of at least one element from each of groups Ib, IIIb, and VIb, as for example CIS films or CIGS films can be p-type or highly resistive n-type (that is, n-type with low carrier density). The carrier density can be set to n+ by further including a group II element, because a portion of the group II elements functions as donors. Moreover, defects in a compound semiconductor layer comprising elements of groups Ib, IIIB, and VIb can be reduced by further including a group II element.

For the group II element in the n-type compound semiconductor layer 12, at least one element selected from the group consisting of Mg, Zn, and Cd can be used, for example. If one of those elements are used for the group II element, an n-type compound semiconductor layer 12 with excellent electrical properties can be obtained.

The p-type compound semiconductor layer 13 comprises at least one element from each of groups Ib, IIIb, and VIb.

In the n-type compound semiconductor layer 12 and in the p-type compound semiconductor layer 13, for example Cu can be used for the group Ib element. For example, at least one metal of the group consisting of In and Ga can be used for the group IIIb element. At least one element of the group consisting of Se and S can be used for the group VIb element. It is preferable that the n-type compound semiconductor layer 12 and the p-type compound semiconductor layer 13 comprise In as a group IIIb element, because this improves the electrical properties. By using the above-mentioned elements for the group Ib element, the group IIIb element, and the group VIb element, a compound semiconductor thin film 10a that is suitable for a solar cell can be obtained.

A semiconductor layer including at least one compound selected from the group consisting of ZnO, Zn(O, OH), Zn(O, OH, S), $SnO_2$, Sn(O, OH), Sn(O, OH, S), $In_2O_3$, In(O, OH), In (O, OH, S), $In_xSe_y$, and $ZnIn_xSe_y$ can be used for the n-type semiconductor layer 14. By using such a semiconductor layer for the n-type semiconductor layer 14, a semiconductor thin film 10b that is suitable for a solar cell can be obtained.

It is preferable that the proportion of the group Ib element, the group IIIb element, and the group VIb element in the n-type compound semiconductor layer 12 of the semiconductor thin film 10a or 10b is about 1:3:5, because this facilitates the manufacturing of the n-type semiconductor layer 12. If the proportion of the group Ib element, the group IIIb element, and the group VIb element in the n-type compound semiconductor layer 12 is X:Y:Z (with $0.05 \leq X \leq 0.2$; $0.25 \leq Y \leq 0.4$; and $0.45 \leq Z \leq 0.65$), the same effect can be attained as when the proportion is about 1:3:5. This is also true for the following embodiments.

It is preferable that the proportion of the group Ib element, the group IIIb element, and the group VIb element in the p-type compound semiconductor layer 13 of the semiconductor thin film 10a or 10b is about 1:1:2, because this allows the introduction of group II elements principally in the n-type compound semiconductor layer 12. If the proportion of the group Ib element, the group IIIb element, and the group VIb element in the p-type compound semiconductor layer 13 is U:V:W (with $0.15 \leq U \leq 0.35$; $0.15 \leq V \leq 0.35$; and $0.4 \leq W \leq 0.6$), the same effect can be attained as when the proportion is about 1:1:2. This is also true for the following embodiments.

The semiconductor thin films 10a and 10b according to this first embodiment include an n-type compound semiconductor thin film 12. Consequently, the semiconductor thin films 10a and 10b can form a favorable pn-junction with a p-type CIS film or CIGS film.

The semiconductor thin film 10a in accordance with this first embodiment comprises a p-type compound semiconductor layer 13 including at least one element from each of groups Ib, IIIb, and VIb, and an n-type compound semiconductor layer 12 including at least one element from each of groups Ib, IIIb, and VIb, deposited on the p-type compound semiconductor layer 13. Consequently, this semiconductor thin film 10a has few defects at the interface of the pn-junction and is suitable for a solar cell.

The semiconductor thin film 10b in accordance with the first embodiment comprises a p-type compound semiconductor layer 13 including at least one element from each of groups Ib, IIIb, and VIb, an n-type compound semiconductor layer 12 including at least one element from each of groups Ib, IIIb, and VIb, deposited on the p-type compound semiconductor layer 13, and an n-type semiconductor layer 14 formed on the n-type compound semiconductor layer 12. Consequently, this semiconductor thin film 10b has few defects at the interface of the pn-junction and is suitable for a solar cell.

Second Embodiment

The following describes a second embodiment of the present invention referring to a non-limiting example of a method for manufacturing the semiconductor thin films 10a and 10b of the first embodiment with the n-type compound semiconductor layer 12, using a solution that includes ions of a group II element. The substrate 11, the n-type compound semiconductor layer 12, the p-type compound semiconductor layer 13, and the n-type semiconductor layer 14 are the same as explained for the first embodiment, so that their description has been omitted here.

Figure 3:
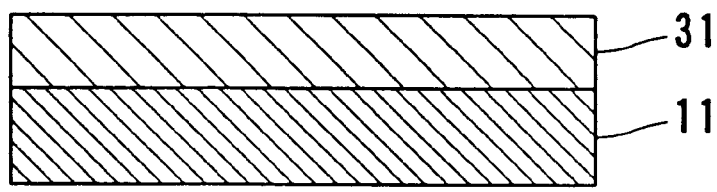
FIGS. 3 (A)–(C) are cross-sectional views illustrating a method for manufacturing a semiconductor thin film in accordance with the present invention.
Figure 3:
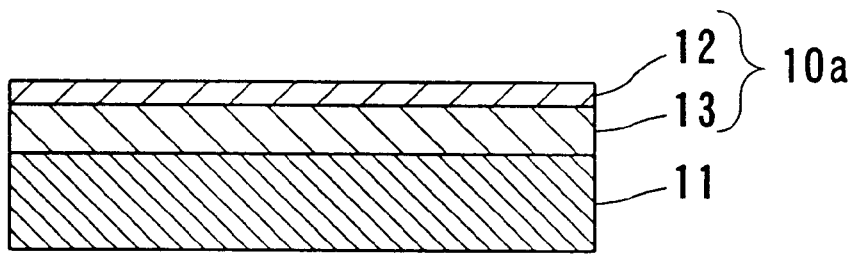
Figure 3:
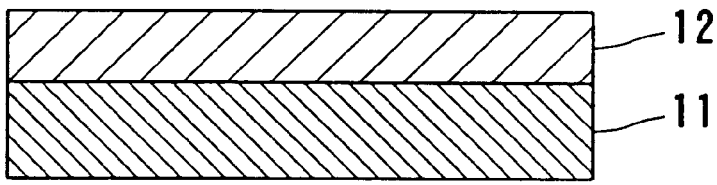

FIG. 3 illustrates a method for manufacturing the semiconductor thin films 10a and 10b with the n-type compound semiconductor layer 12.

As is shown in FIG. 3(A), a compound semiconductor layer 31 (first compound semiconductor layer) is formed on a substrate 11. The compound semiconductor layer 31 comprises elements of groups Ib, IIIb, and VIb. For example, p-type $CuInSe_2$ or $Cu(In, Ga)Se_2$, or highly resistive n-type $CuIn_3Se_5$ or $Cu(In, Ga)_3Se_5$ can be used for the compound semiconductor layer 31. The compound semiconductor layer 31 can be formed by sputtering or vapor deposition, for example.

For forming the compound semiconductor layer 31 by sputtering, Cu, In, Ga and Se targets can be used, for example, with Ar gas as the sputtering gas at a substrate temperature of 200° C. and $8 \times 10^{-3}$ Torr chamber pressure.

For forming the compound semiconductor layer 31 by vapor deposition, Cu, In, Ga and Se can be used for the vapor deposition sources, for example, with a substrate temperature of 350° C.–550° C. and $1 \times 10^{-8}$ Torr chamber pressure.

Then, by contacting the compound semiconductor layer 31 with a solution including ions of a group II element, a group II element is introduced to the compound semiconductor layer 31, whereby an n-type compound semiconductor layer 12 is formed, which has a high carrier density and includes at least one element from each of groups Ib, IIIb, VIb, and II. If the proportion of the group Ib element, the group IIIb element, and the group VIb element in the compound semiconductor layer 31 is about 1:1:2, the group II element is taken into only a surface layer of the compound semiconductor layer 31, and a semiconductor thin film 10a is formed that comprises a p-type compound semiconductor layer 13 and an adjacent n-type compound semiconductor layer 12, as shown in FIG. 3(B). On the other hand, if the proportion of the group Ib element, the group IIIb element, and the group VIb element in the compound semiconductor layer 31 is about 1:3:5, the group II element is taken in substantially homogeneously to a certain depth from the surface of the compound semiconductor layer 31. Therefore, if the compound semiconductor layer 31 is thin (for example, less than 30 nm), the group II element is taken in substantially homogeneously throughout the entire compound semiconductor layer 31, and an n-type compound semiconductor layer as shown in FIG. 3(C) is formed. The depth to which the group II element is taken in increases with the time that the solution is applied.

Figure 4:
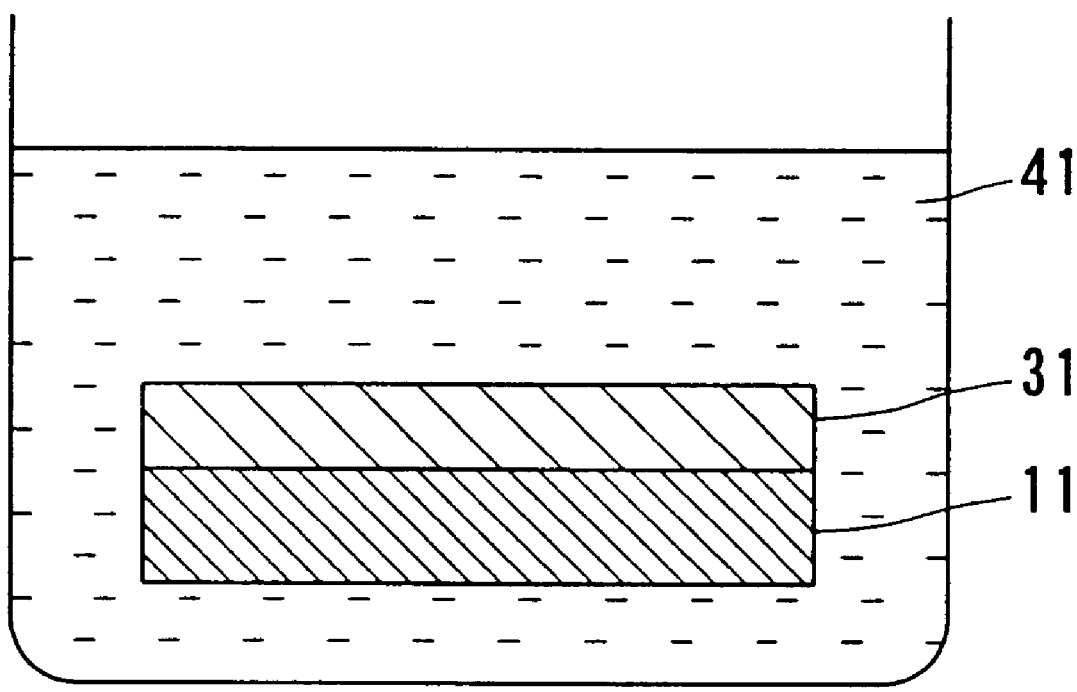
FIG. 4 is a diagram illustrating a step in the method for manufacturing a semiconductor thin film in accordance with the present invention.

The compound semiconductor layer 31 can be contacted with the solution that includes ions of a group II element by immersing a substrate 11 into a solution 41 including a group II element, as shown in FIG. 4.

The solution 41 includes for example at least one solute selected from the group consisting of the halides, acetates, nitrates and sulfates of the group II elements. As the group II element, at least one element selected from the group consisting of Mg, Zn and Cd can be used for example. The amount of the group II element that is taken in by the compound semiconductor layer 31 can be increased by adding ammonia to the solution 41.

It is preferable that the temperature of the solution 41 is 10° C. to 100° C.

It is preferable that the pH of the solution 41 is 10 to 12.

It is preferable that the n-type compound semiconductor layer 12 is heat-treated after the step shown in FIG. 4, because such a heat-treatment improves the crystallinity of the n-type compound semiconductor layer 12.

It is preferable that the heat-treatment of the n-type compound semiconductor layer 12 is performed either in a gas atmosphere consisting of at least one gas selected from the group consisting of nitrogen, hydrogen sulfide, and argon, or in a vacuum. Moreover, it is preferable that the heat-treatment of the n-type compound semiconductor layer 12 is performed at a temperature of 100° C. to 600° C.

To form a semiconductor thin film 10b as explained in the first embodiment, an n-type semiconductor layer 14 is formed on the n-type compound semiconductor layer 12 shown in FIG. 3(B). The n-type semiconductor layer 14 can be formed, for example, by sputtering, vapor deposition, CVD (chemical vapor deposition), CBD (chemical bath deposition), or ALD (atomic layer deposition). It is preferable to form the n-type semiconductor layer 14 by vapor deposition, MOCVD (metal organic chemical vapor deposition), chemical bath deposition, or ALD, because this reduces the damage inflicted on the n-type compound semiconductor layer 12.

The method for manufacturing a semiconductor thin film in accordance with this second embodiment facilitates manufacturing the n-type compound semiconductor layer 12 of the semiconductor thin films 10a and 10b.

For this second embodiment, a solution including ions of a group II element has been used, but the solution also can include ions of other elements with the ions of a group II element. Especially if the solution contains ions of group 1A elements besides the ions of a group II element, it can be expected that the group 1A element ions taken into the film reduce the defects with the film.

Third Embodiment

The following describes a third embodiment of the present invention referring to another example of a method for manufacturing the semiconductor thin films 10a and 10b of the first embodiment with the n-type compound semiconductor layer 12, using a solution that includes ions of a group II element. Again, the substrate 11, the n-type compound semiconductor layer 12, and the n-type semiconductor layer 14 are the same as explained for the first embodiment, so that their description has been omitted here.

Figure 5:
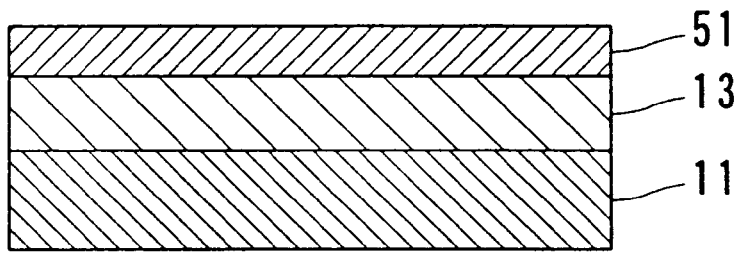
FIGS. 5 (A)–(C) are cross-sectional views illustrating another method for manufacturing a semiconductor thin film in accordance with the present invention.
Figure 5:
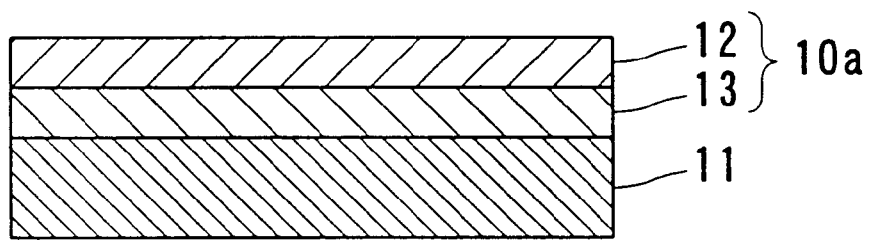
Figure 5:
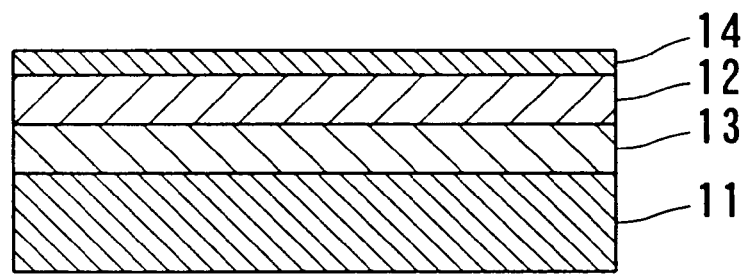

First of all, a p-type compound semiconductor layer 13 and a compound semiconductor layer 51 (first compound semiconductor layer) are formed, for example by vapor deposition or sputtering, on a substrate 11, as shown in FIG. 5(A). The p-type compound semiconductor layer 13 of the third embodiment comprises elements the groups Ib, IIIb, and VIb at a proportion of about 1:1:2. The compound semiconductor layer 51 comprises elements of the groups Ib, IIIb, and VIb at a proportion of about 1:3:5. A highly resistive n-type semiconductor such as $CuIn_3Se_5$ or $Cu(In, Ga)_3Se_5$ can be used for the compound semiconductor layer 51, for example. The p-type compound semiconductor layer 13 and the compound semiconductor layer 51 can be formed by the same methods as the compound semiconductor layer 31 in the second embodiment.

Then, a semiconductor thin film 10a comprising the p-type compound semiconductor layer 13 and the n-type compound semiconductor layer 12 as is shown in FIG. 5(B) is obtained by introducing a group II element principally into the compound semiconductor layer 51. Group II elements can be introduced principally into the compound semiconductor layer 51, as has been explained in the second embodiment, by contacting the compound semiconductor layer 51 with a solution 41 that contains ions of the group II element. Since the group II element is more easily taken into the compound semiconductor layer 51 comprising the group Ib element, the group IIIb element, and the group VIb element at a proportion of about 1:3:5 than into the p-type compound semiconductor layer 13, where this proportion is 1:1:2, the group II element can be introduced principally into the compound semiconductor layer 51.

As shown in FIG. 5(C), to manufacture a semiconductor thin film 10b as explained in the first embodiment, an n-type semiconductor layer 14 is formed on the n-type compound semiconductor layer 12 after the step in FIG. 5(B). This n-type semiconductor layer 14 can be formed as explained in the second embodiment.

This method for manufacturing a semiconductor thin film according to the third embodiment facilitates manufacturing the semiconductor thin films 10a and 10b explained in the first embodiment.

Fourth Embodiment

The following describes a fourth embodiment of the present invention referring to a non-limiting example of a method for manufacturing the semiconductor thin films 10a and 10b of the first embodiment with the n-type compound semiconductor layer 12, by thermal diffusion of a group II element. Again, the substrate 11, the n-type compound semiconductor layer 12, the p-type compound semiconductor layer 13, the n-type semiconductor layer 14, and the compound semiconductor layer 51 are the same as explained for the first to third embodiment, so that their description has been omitted here.

Figure 6:
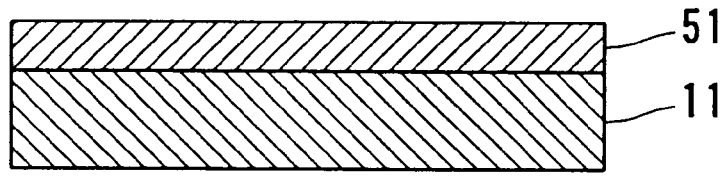
FIGS. 6 (A)–(C) are cross-sectional views illustrating yet another method for manufacturing a semiconductor thin film in accordance with the present invention.
Figure 6:
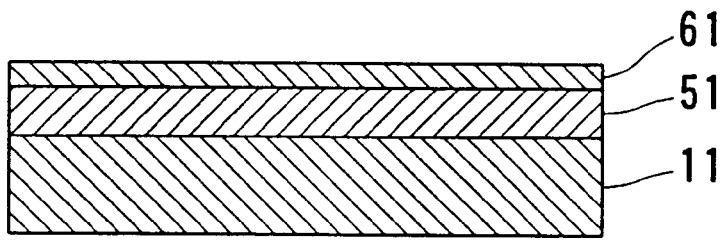
Figure 6:
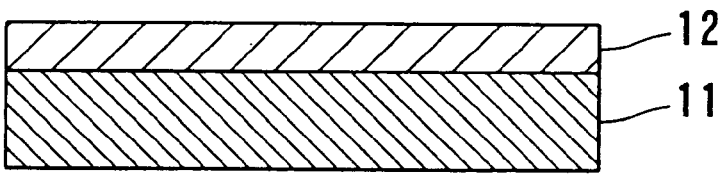

First of all, the compound semiconductor layer 51 is formed on the substrate 11, as shown in FIG. 6(A).

Then, as is shown in FIG. 6(B), a metal thin film 61, which includes a group II element, is formed on the compound semiconductor layer 51. For the group II element, at least one element of the group consisting of Mg, Zn and Cd can be used for example.

Then, an n-type compound semiconductor layer 12 comprising at least one element from each of groups Ib, IIIb, VIb, and II, as shown in FIG. 6(C), is formed by thermal diffusion of the group II element included in the metal thin film 61 into the compound semiconductor layer 51.

The thermal diffusion can be performed, for example, by heating for one hour at 250° C.

To manufacture the semiconductor thin film 10a of the first embodiment, the group II element can be introduced into the compound semiconductor layer 51 by thermal diffusion after depositing a p-type compound semiconductor layer 13 and an adjacent compound semiconductor layer 51 on the substrate 11, as has been explained for the third embodiment. Also in the manufacturing method of this fourth embodiment, which uses thermal diffusion, the group II element is taken principally into the compound semiconductor layer 51, as in the third embodiment.

Furthermore, to manufacture the semiconductor thin film 10b of the first embodiment, an n-type semiconductor layer 14 can be formed by the method of the third embodiment on the semiconductor thin film 10a, which has been manufactured as described above.

This method for manufacturing a semiconductor thin film according to this fourth embodiment facilitates manufacturing the semiconductor thin films 10a and 10b with n-type compound semiconductor layer 12 explained in the first embodiment.

Fifth Embodiment

The following describes a fifth embodiment of the present invention referring to a non-limiting example of a method for manufacturing the semiconductor thin films 10a and 10b of the first embodiment with the n-type compound semiconductor layer 12, by simultaneously depositing the group Ib element, the group IIIb element, the group VIb element, and the group II element.

According to this fifth embodiment, the n-type compound semiconductor layer 12 is formed by simultaneously depositing the group Ib element, the group IIIB element, the group VIb element, and the group II element on a surface with vapor deposition or sputtering using targets including the group Ib element, the group IIIB element, the group VIb element, and the group II element.

For forming the n-type compound semiconductor layer 12 by sputtering, Cu, In, Ga, Zn and Se targets can be used for example, with Ar gas as the sputtering gas at a substrate temperature of 200° C. and $8 \times 10^{-3}$ Torr chamber pressure.

For forming the n-type compound semiconductor layer 12 by vapor deposition, Cu, In, Ga, Zn and Se can be used for the vapor deposition sources, for example, with a substrate temperature of 350° C.–550° C. and $1 \times 10^{-8}$ Torr chamber pressure.

To manufacture the semiconductor thin film 10a, the n-type compound semiconductor layer 12 can be formed after forming the p-type compound semiconductor layer 13 on the substrate 11. Furthermore, to manufacture the semiconductor thin film 10b, a further n-type semiconductor layer 14 can be formed after forming the n-type compound semiconductor layer 12. The p-type compound semiconductor layer 13 and the n-type semiconductor layer 14 can be formed, for example, by vapor deposition or sputtering.

This method for manufacturing a semiconductor thin film according to this fifth embodiment facilitates manufacturing the semiconductor thin films 10a and 10b with the n-type compound semiconductor layer 12 explained in the first embodiment.

Sixth Embodiment

The following describes a sixth embodiment of the present invention referring to a non-limiting example of a solar cell, which includes a semiconductor thin film according to the first embodiment.

Figure 7:
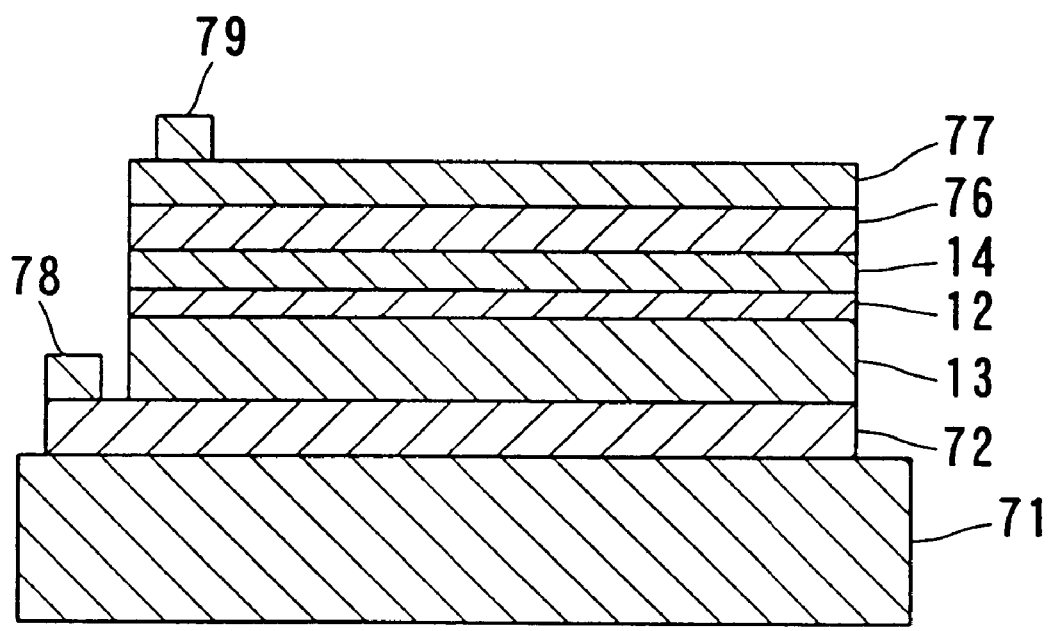
FIG. 7 is a cross-sectional view illustrating a solar cell in accordance with the present invention.

FIG. 7 shows a solar cell 70 in accordance with the sixth embodiment: A rear electrode 72, a p-type compound semiconductor layer 13, an n-type compound semiconductor layer 12, an n-type semiconductor layer 14, a window layer 76, and a transparent conductive film 77 are formed in this order on a substrate 71. The solar cell 70 further comprises a p-side electrode 78 and an n-side electrode 79.

The n-type compound semiconductor layer 12, the p-type compound semiconductor layer 13, and the n-type semiconductor layer 14 are the same as explained in the first embodiment, and can be manufactured by one of the methods explained in the second to fifth embodiment.

For the substrate 71, for example a glass substrate, a stainless steel substrate, a semiconductor film, a polysulfite film (Kapton; trademark of DuPont Ind.) or a polyimide film can be used. For the rear electrode 72, for example a Mo film can be used. For the window layer 76, for example a ZnO film can be used. For the transparent conductive film 77, for example an ITO (indium tin oxide) film can be used. For the p-side electrode 78 and the n-side electrode 79, for example a metal film such as a NiCr film and a Au film can be used.

The rear electrode 72, the window layer 76, the transparent conductive film 77, the p-side electrode 78, and the n-side electrode 79 can be formed by usual methods, such as sputtering, vapor deposition, or CVD.

The solar cell according to the sixth embodiment comprises an inventive semiconductor thin film 10b forming a pn-junction with the p-type compound semiconductor layer 13 and the n-type compound semiconductor layer 12. Consequently, in accordance with this sixth embodiment a solar cell with few defects near the interface of the pn-junction and high conversion efficiency can be attained.

This sixth embodiment describes only a non-limiting example of a solar cell, and other configurations containing the inventive semiconductor thin film are possible.

EXAMPLES

The following is a more detailed discussion of non-limiting examples of the present invention.

Example 1

Example 1 illustrates how the n-type compound semiconductor layer 12 is formed with the method explained in the third embodiment.

First of all, a Mo film was formed by vapor deposition on a glass substrate, and a Cu(In, Ga)Se$_2$ film was formed by vapor deposition on the Mo film.

Then, an aqueous solution including a compound of an element of group II as a solute was prepared. The container holding the solution was kept in a bath maintained at a constant temperature of 85° C. The glass substrate whereon the Cu(In, Ga)Se$_2$ film had been formed was immersed into this solution for a certain time, and rinsed with aqua pura upon retrieval. The temperature of the solution was about 80° C. when the substrate was retrieved. Table 1 shows the concentration and the immersion time for different solutes.

TABLE 1

| Sample No. | Compound | Concentration (mol/l) | Immersion Time (min) |
|---|---|---|---|
| 1 | ZnSO$_4$ | 0.0015 | 6 |
| 2 | ZnSO$_4$ | 0.01 | 10 |
| 3 | MgSO$_4$ | 0.01 | 6 |
| 4 | MgSO$_4$ | 0.01 | 10 |
| 5 | CdSO$_4$ | 0.0015 | 6 |

After the Samples 1–5 in Table 1 were treated with the solution, they were heat-treated by exposing the samples to a nitrogen atmosphere of 250° C. for 30min.

Figure 8:
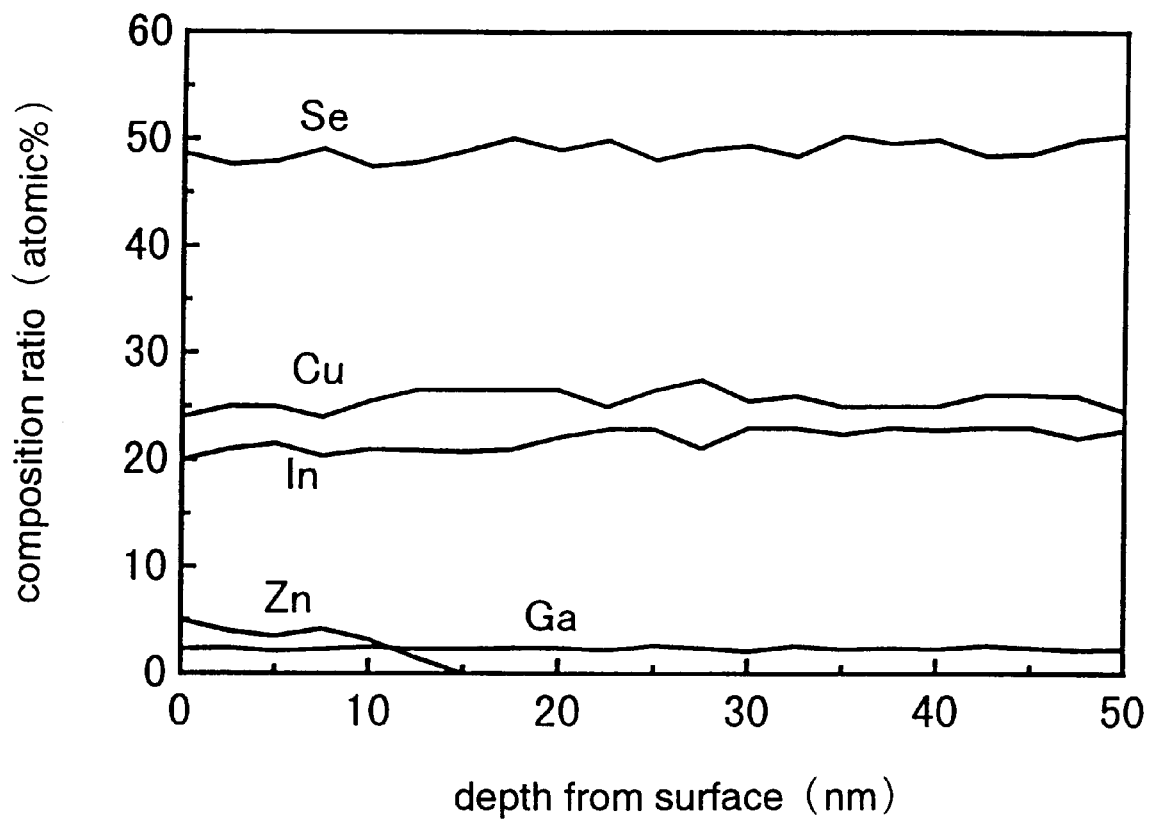
FIG. 8 is a graph showing the results of an Auger electron spectroscopic analysis for a semiconductor thin film of the present invention.
Figure 9:
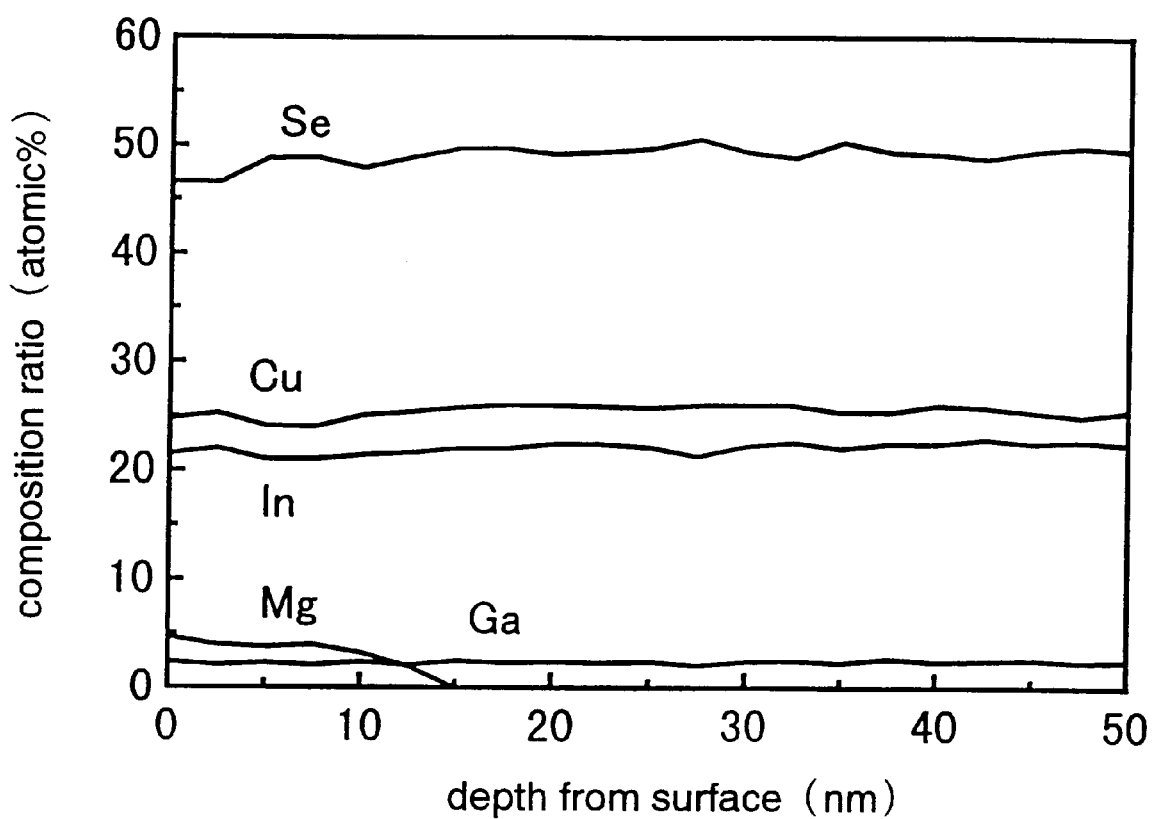
FIG. 9 is a graph showing the results of an Auger electron spectroscopic analysis for another semiconductor thin film of the present invention.
Figure 10:
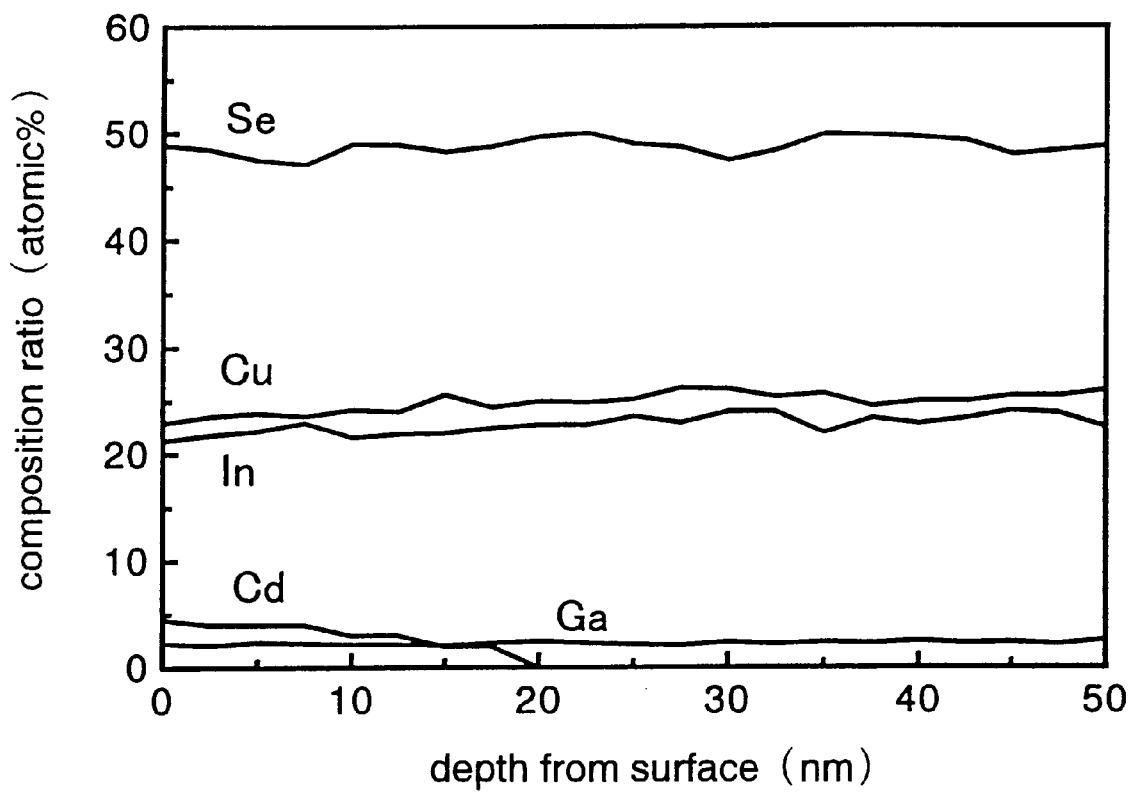
FIG. 10 is a graph showing the results of an Auger electron spectroscopic analysis for yet another semiconductor thin film of the present invention.
Figure 11:
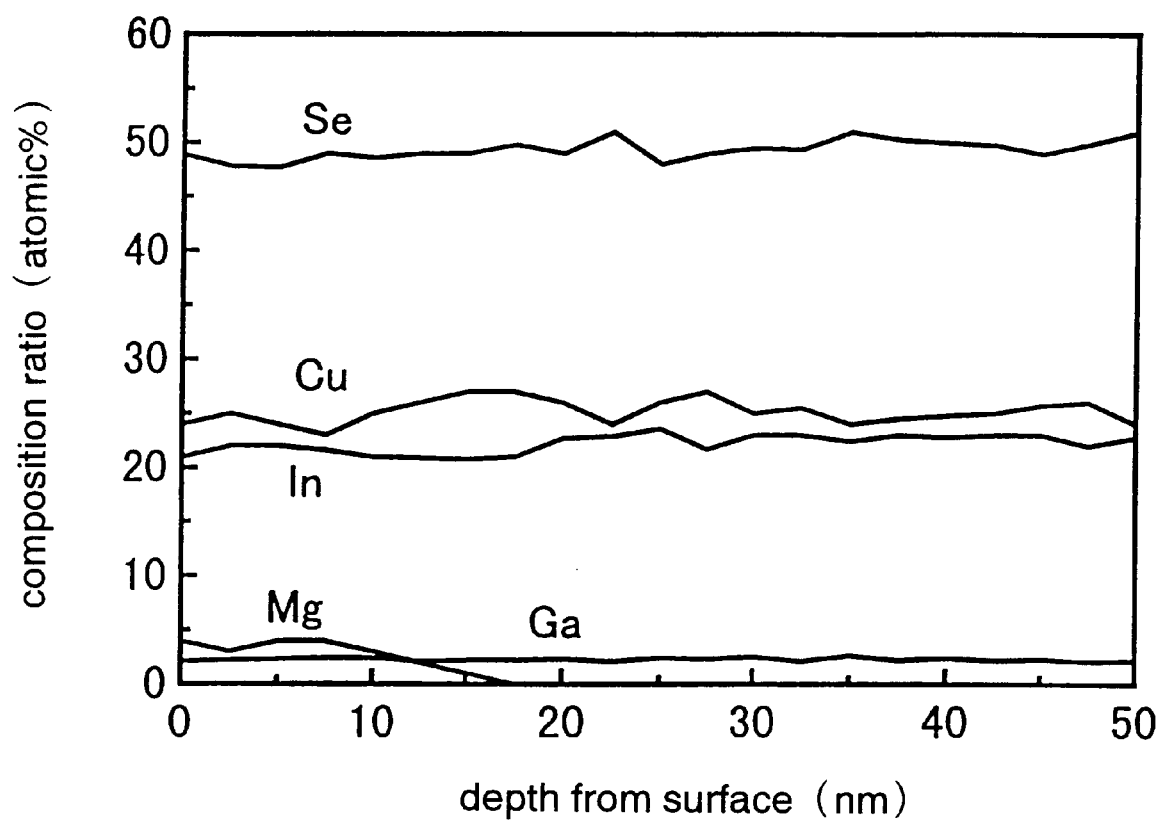
FIG. 11 is a graph showing the results of a photoelectron spectroscopic analysis for a semiconductor thin film of the present invention.
Figure 1:
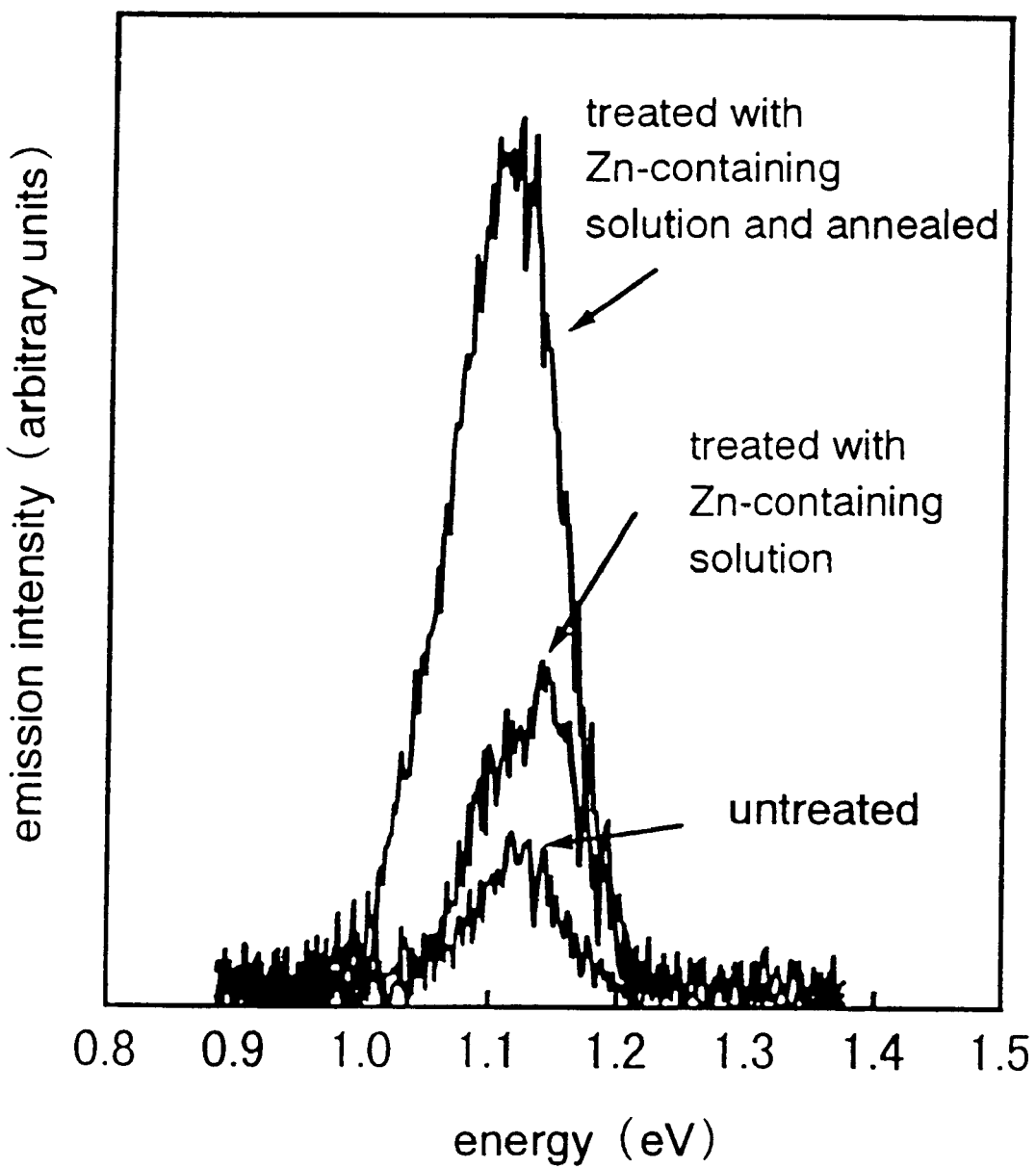

After the heat-treatment, the composition of the Cu(In, Ga)Se$_2$ film depending on the film depth was measured by Auger electron spectroscopic analysis. The result of the measurement for Sample 2 is shown in FIG. 8, the result for Sample 4 is shown in FIG. 9, and the result for Sample 5 is shown in FIG. 10. Furthermore, the composition of the Cu(In, Ga)Se$_2$ film of Sample 3 depending on the film depth was measured by photoelectron spectroscopic analysis, and the result of this measurement is shown in FIG. 11.

As is shown in FIGS. 8–11, the group II element was taken into the surface of the Cu(In, Ga)Se$_2$ film when the same was treated with a solution containing ions of the group II element. Thus, a group II element could be included in the surface of the Cu(In, Ga)Se$_2$ film by treating it with a solution containing ions of the group II element. The same results were obtained also for samples that are not shown in the drawings. Moreover, when the current-voltage characteristics for the Cu(In, Ga)Se$_2$ films of the Samples 1 to 5 in a vertical direction were examined, the Cu(In, Ga)Se$_2$ films that were treated with the solution showed rectification, which showed that a pn-junction was formed. On the other hand, those Cu(In, Ga)Se$_2$ films that had not been treated with the solution showed only ohmic behavior. This showed that due to the treatment with the solution, the group II element was taken into the p-type Cu(In, Ga)Se$_2$ films, and the surface became n-type.

Figure 13:
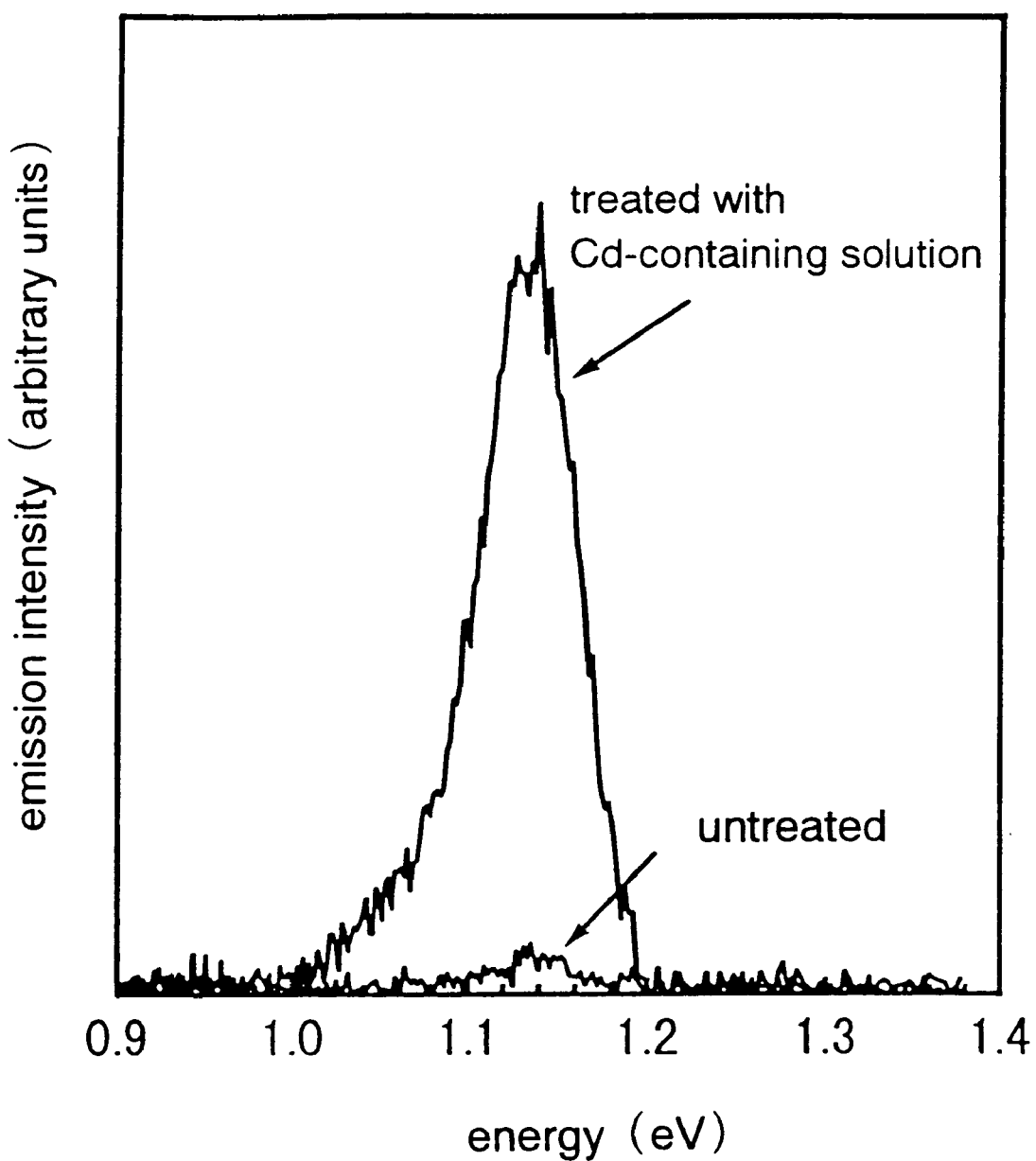
FIG. 13 illustrates the measured photoluminescence of another semiconductor thin film of the present invention.

Moreover, the photoluminescence of the treated Cu(In, Ga)Se$_2$ film was measured. The results for Sample 1 are shown in FIG. 12, and the results of Sample 5 are shown in FIG. 13. The abscissa of these graphs marks the energy, whereas the ordinate marks the emission intensity. As becomes clear from FIGS. 12 and 13, the emission intensity of a Cu(In, Ga)Se$_2$ film that has been treated with the solution is higher than the emission intensity of a Cu(In, Ga)Se$_2$ film that has not been treated with the solution. This is probably because defects in the surface of the Cu(In, Ga)Se$_2$ film are buried by the group II element when the film is treated with a solution that contains ions of the group II element.

Furthermore, as can be seen in FIG. 12, the emission intensity of a Cu(In, Ga)Se$_2$ film that has been heat-treated after the treatment with a solution is even higher. This is probably because the heating increases the crystallinity of the surface of the Cu(In, Ga)Se$_2$ film.

Moreover, a ZnO-based n-type semiconductor layer was formed on the Cu(In, Ga)Se$_2$ film of the heat-treated Samples 1–5, and the photoluminescence was measured. This ZnO-based n-type semiconductor layer was formed by chemical bath deposition or ALD.

To form a Zn(O, OH, S) film by chemical bath deposition, first, a solution was prepared by mixing zinc acetate (Zn(CH$_3$COO)$_2$), thiourea (NH$_2$CSNH$_2$), and aqueous ammonia. The concentration of the zinc acetate was 0.02 mol/l, the concentration of the thiourea was 0.4 mol/l, and the concentration of the ammonia was 2.5 mol/l. The container holding the solution was kept in a bath maintained at a constant temperature of 85° C. After the heat-treated Samples 1–5 were immersed into the solution for about 20 min, they were retrieved and rinsed with aqua pura. The temperature of the solution was about 80° C. when the substrate was retrieved. Thus, a Zn(O, OH, S) film was formed by chemical bath deposition.

Moreover, to form a ZnO film by ALD, first, the heat-treated samples were placed in a reaction chamber, and heated to 150° C. with a heater. Then, a ZnO film was formed by alternately introducing diethylzinc (($C_2H_5)_2Zn$) and heavy water ($D_2O$) into the pressure-reduced reaction chamber. The thickness of the resulting ZnO film was 50 nm–300 nm.

The photoluminescence of the samples on which such a ZnO-based n-type semiconductor layer had been formed was higher than the photoluminescence of the samples on which the ZnO-based n-type semiconductor layer had not been formed. The same result was obtained when the ZnO-based n-type semiconductor layer was formed by MOCVD or vapor deposition instead of chemical bath deposition or ALD.

Thus, defects at the semiconductor thin film surface could be reduced, and a semiconductor thin film suitable for a semiconductor element was obtained.

Example 2

Example 2 illustrates how a solar cell using a semiconductor thin film of the present invention is manufactured.

First, a Mo film was formed as the rear electrode on a glass substrate, and a Cu(In, Ga)$Se_2$ was formed as the p-type compound semiconductor layer on the Mo layer. Then, this glass substrate was immersed for 10 min in an aqueous solution containing ions of a group II element, and rinsed with aqua pura upon retrieval from the solution. Then, some of the samples ware heat-treated. The heat treatment was performed at 100° C.–600° C. After this, a ZnO-based n-type semiconductor layer was formed on the Cu(In, Ga)$Se_2$ layer by chemical bath deposition as explained for Example 1. Moreover, a ZnO film (of 0.2 μm thickness) and an ITO film (of 0.1 μm thickness) were formed on the ZnO-based n-type semiconductor layer as the window layer and the transparent conductive layer, respectively, by sputtering (Ar gas, $8 \times 10^{-3}$ Torr, 500 W high-frequency power).

The characteristics of the resulting solar cells were measured by irradiating them with AM (air mass) 1.5, 100 m W/$cm^2$ artificial sunlight.

Table 2 lists the conversion efficiency of these solar cells for different group II ions, ion densities, temperatures, and pH-values of the solution used for the treatment.

TABLE 2

| Sample No. | Group II Element | Concentration (mol/l) | Temperature | pH | Conversion Efficiency (%) |
|---|---|---|---|---|---|
| 6 | — | — | — | — | 14 |
| 7 | Mg | 0.0001 | 10 | 7 | 16 |
| 8 | Mg | 0.0001 | 10 | 13 | 15 |
| 9 | Mg | 0.0001 | 50 | 7 | 15 |
| 10 | Mg | 0.0001 | 50 | 13 | 15 |
| 11 | Mg | 0.0001 | 90 | 7 | 15 |
| 12 | Mg | 0.0001 | 90 | 13 | 15 |
| 13 | Mg | 0.0010 | 10 | 7 | 16 |
| 14 | Mg | 0.0010 | 10 | 13 | 16 |
| 15 | Mg | 0.0010 | 50 | 7 | 16 |
| 16 | Mg | 0.0010 | 50 | 13 | 16 |
| 17 | Mg | 0.0010 | 90 | 7 | 16 |
| 18 | Mg | 0.0010 | 90 | 13 | 16 |
| 19 | Mg | 0.0100 | 10 | 7 | 17 |
| 20 | Mg | 0.0100 | 10 | 13 | 17 |
| 21 | Mg | 0.0100 | 50 | 7 | 17 |
| 22 | Mg | 0.0100 | 50 | 13 | 17 |
| 23 | Mg | 0.0100 | 90 | 7 | 17 |
| 24 | Mg | 0.0100 | 90 | 13 | 17 |
| 25 | Zn | 0.0001 | 10 | 2 | 16 |
| 26 | Zn | 0.0001 | 10 | 7 | 16 |
| 27 | Zn | 0.0001 | 10 | 13 | 15 |
| 28 | Zn | 0.0001 | 50 | 2 | 15 |
| 29 | Zn | 0.0001 | 50 | 7 | 15 |
| 30 | Zn | 0.0001 | 50 | 13 | 15 |
| 31 | Zn | 0.0001 | 90 | 2 | 15 |
| 32 | Zn | 0.0001 | 90 | 7 | 15 |
| 33 | Zn | 0.0001 | 90 | 13 | 15 |
| 34 | Zn | 0.0010 | 10 | 2 | 16 |
| 35 | Zn | 0.0010 | 10 | 7 | 16 |
| 36 | Zn | 0.0010 | 10 | 13 | 16 |
| 37 | Zn | 0.0010 | 50 | 2 | 16 |
| 38 | Zn | 0.0010 | 50 | 7 | 16 |
| 39 | Zn | 0.0010 | 50 | 13 | 16 |
| 40 | Zn | 0.0010 | 90 | 2 | 16 |
| 41 | Zn | 0.0010 | 90 | 7 | 16 |
| 42 | Zn | 0.0010 | 90 | 13 | 16 |
| 43 | Zn | 0.0100 | 10 | 2 | 17 |
| 44 | Zn | 0.0100 | 10 | 7 | 17 |
| 45 | Zn | 0.0100 | 10 | 13 | 17 |
| 46 | Zn | 0.0100 | 50 | 2 | 17 |
| 47 | Zn | 0.0100 | 50 | 7 | 17 |
| 48 | Zn | 0.0100 | 50 | 13 | 17 |
| 49 | Zn | 0.0100 | 90 | 2 | 17 |
| 50 | Zn | 0.0100 | 90 | 7 | 17 |
| 51 | Zn | 0.0100 | 90 | 13 | 17 |
| 52 | Cd | 0.0001 | 10 | 2 | 16 |
| 53 | Cd | 0.0001 | 10 | 7 | 16 |
| 54 | Cd | 0.0001 | 10 | 13 | 15 |
| 55 | Cd | 0.0001 | 50 | 2 | 15 |
| 56 | Cd | 0.0001 | 50 | 7 | 15 |
| 57 | Cd | 0.0001 | 50 | 13 | 15 |
| 58 | Cd | 0.0001 | 90 | 2 | 15 |
| 59 | Cd | 0.0001 | 90 | 7 | 15 |
| 60 | Cd | 0.0001 | 90 | 13 | 15 |
| 61 | Cd | 0.0010 | 10 | 2 | 16 |
| 62 | Cd | 0.0010 | 10 | 7 | 16 |
| 63 | Cd | 0.0010 | 10 | 13 | 16 |
| 64 | Cd | 0.0010 | 50 | 2 | 16 |
| 65 | Cd | 0.0010 | 50 | 7 | 16 |
| 66 | Cd | 0.0010 | 50 | 13 | 16 |
| 67 | Cd | 0.0010 | 90 | 2 | 16 |
| 68 | Cd | 0.0010 | 90 | 7 | 16 |
| 69 | Cd | 0.0010 | 90 | 13 | 16 |
| 70 | Cd | 0.0100 | 10 | 2 | 17 |
| 71 | Cd | 0.0100 | 10 | 7 | 17 |
| 72 | Cd | 0.0100 | 10 | 13 | 17 |
| 73 | Cd | 0.0100 | 50 | 2 | 17 |
| 74 | Cd | 0.0100 | 50 | 7 | 17 |
| 75 | Cd | 0.0100 | 50 | 13 | 17 |
| 76 | Cd | 0.0100 | 90 | 2 | 17 |
| 77 | Cd | 0.0100 | 90 | 7 | 17 |
| 78 | Cd | 0.0100 | 90 | 13 | 17 |

Sample 6 is a comparative example, which has not been treated with the solution. As becomes clear from Table 2, when Mg, Zn or Cd are used for the group II element, the conversion efficiency of the solar cell increases. The conversion efficiency increases especially if the concentration of ions of the group II element is set at 0.001 mol/l. The conversion efficiency increases even more if the concentration of ions of the group II element is set at 0.01 mol/l.

Table 3 lists the conversion efficiencies of solar cells for different conditions for heat-treating the Cu(In, Ga)Se$_2$ film after treating it with the solution.

TABLE 3

| Sample No. | Group II Element | Heat-treatment Temperature(° C.) | Conversion Efficiency (%) |
| --- | --- | --- | --- |
| 79 | Mg | — | 13 |
| 80 | Mg | 100 | 14 |
| 81 | Mg | 200 | 15 |
| 82 | Mg | 250 | 17 |
| 83 | Mg | 300 | 16 |
| 84 | Mg | 400 | 16 |
| 85 | Mg | 500 | 15 |
| 86 | Mg | 600 | 15 |
| 87 | Zn | — | 14 |
| 88 | Zn | 100 | 15 |
| 89 | Zn | 200 | 16 |
| 90 | Zn | 250 | 18 |
| 91 | Zn | 300 | 17 |
| 92 | Zn | 400 | 17 |
| 93 | Zn | 500 | 16 |
| 94 | Zn | 600 | 16 |
| 95 | Cd | — | 14 |
| 96 | Cd | 100 | 15 |
| 97 | Cd | 200 | 16 |
| 98 | Cd | 250 | 18 |
| 99 | Cd | 300 | 17 |
| 100 | Cd | 400 | 17 |
| 101 | Cd | 500 | 16 |
| 102 | Cd | 600 | 16 |

Samples 79, 87, and 95 are comparative Examples, that were not heat-treated. As is shown in Table 3, the conversion efficiency of the solar cells was increased by heat-treating at temperatures of 100° C.–600° C. For the heat treatment, a temperature of at least 200° C. is preferable, more preferable is a temperature of 200° C.–400° C.

Example 3

Example 3 illustrates how Cd is introduced into a compound semiconductor layer including elements of the groups Ib, IIIb, and VIb at a proportion of 1:3:5 by contacting the compound semiconductor layer with an aqueous solution that contains a compound including Cd.

First, a Mo film and a CuIn$_3$Se$_5$ film were formed on a glass substrate by vapor deposition.

Then, an aqueous solution comprising cadmium sulfate (CdSO$_4$), which is a compound (salt) containing cadmium, and ammonia was prepared. The concentration of cadmium sulfate in the solution was 0.001 mol/l, and the concentration of ammonia was 1 mol/l. The container holding the solution was kept in a bath maintained at a constant temperature of 85° C. The glass substrate with the CuIn$_3$Se$_5$ film was immersed in the solution for about 6 min. Then, the glass substrate was retrieved and rinsed with aqua pura.

Figure 14:
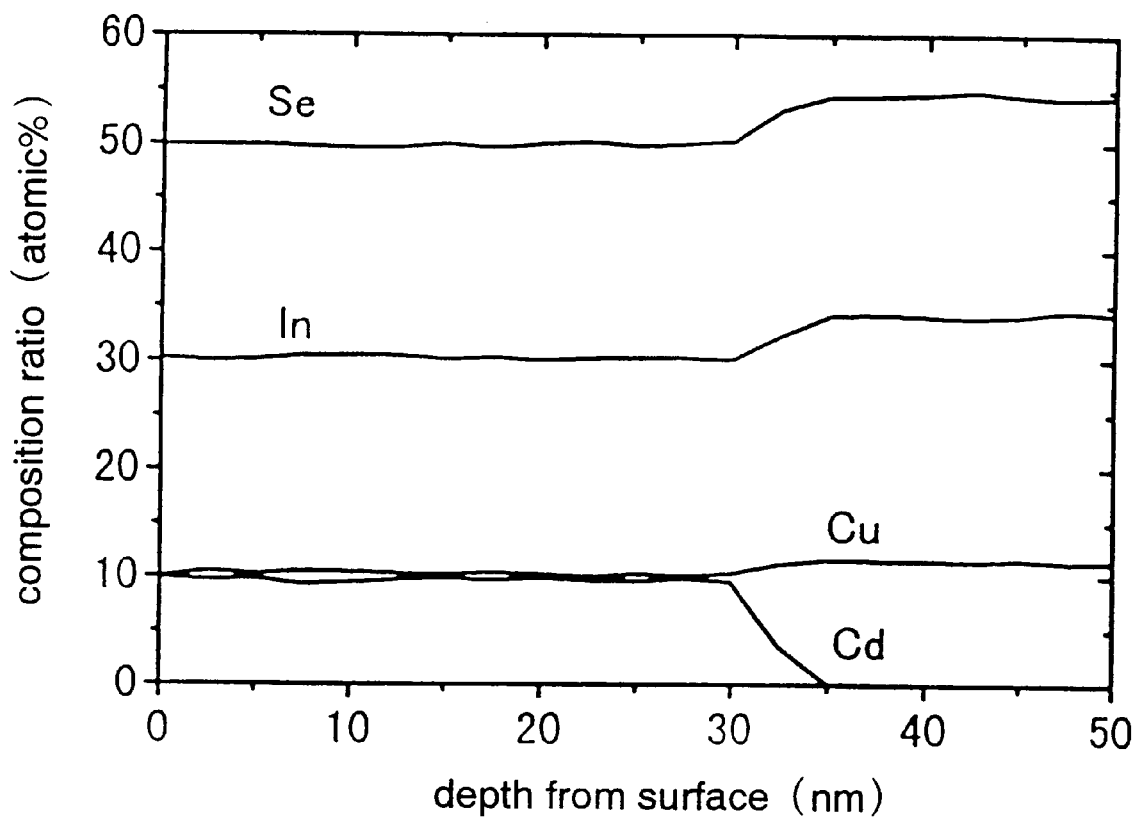
FIG. 14 is a graph showing the results of an Auger electron spectroscopic analysis for yet another semiconductor thin film of the present invention.

After the treatment with the solution, the composition of the CuIn$_3$Se$_5$ film depending on the film depth was measured by Auger electron spectroscopic analysis. The result of the measurement is shown in FIG. 14. The abscissa of FIG. 14 marks the depth from the surface. As is shown in FIG. 14, Cd could be detected to a depth of 35 nm from the surface. Thus, it was verified that the CuIn$_3$Se$_5$ film contained Cd after being immersed in the solution. Furthermore, examining the electrical properties of the CuIn$_3$Se$_5$ film, it was determined that the film was n-type with an electron density of $5\times10^{15}$ cm$^3$.

Thus, Cd could be introduced easily into the CuIn$_3$Se$_5$ film, and an n-type CuIn3Se$_5$ film with a high carrier density was obtained. In this example, cadmium sulfate was used for the Cd salt, but the same results were attained when using, for example, a chloride, an iodide, a bromide, a nitrate, or an acetate.

As a comparative example, the same treatment was performed with a compound semiconductor layer including elements of the groups Ib, IIIb, and VIb at a proportion of 1:1:2, and the differences with the layer including elements of the groups Ib, IIIb, and VIb at a proportion of 1:3:5 were examined.

Figure 15:
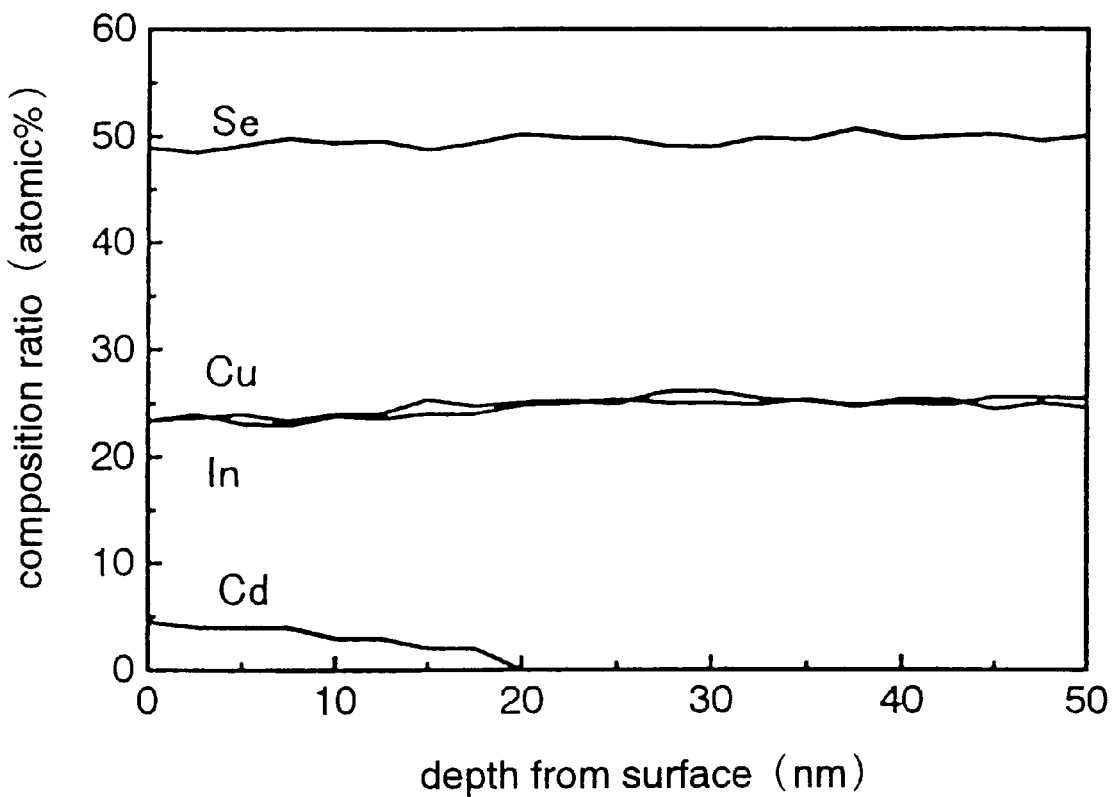
FIG. 15 is a graph showing the results of an Auger electron spectroscopic analysis for yet another semiconductor thin film of the present invention.

After contacting the CuInSe$_2$ film with the Cd-containing solution, the composition of the film depending on the film depth was measured by Auger electron spectroscopic analysis. The result of the measurement is shown in FIG. 15. The abscissa of FIG. 15 marks the depth from the surface.

As becomes clear from FIGS. 14 and 15, the amount of Cd that was introduced into the surface of the compound semiconductor layer was about 10% in the case of a CuIn$_3$Se$_5$ film and about 5% in the case of a CuInSe$_2$ film. And whereas Cd could be detected to a depth of 35 nm in the CuIn$_3$Se$_5$ film, it could be detected only to a depth of 20 nm in the CuInSe$_2$ film. From these results, it can be seen that Cd is more easily introduced into a CuIn$_3$Se$_5$ film than into a CuInSe$_2$ film.

This example related to CuIn$_3$Se$_5$, but the same results were obtained with Cu(In, Ga)$_3$Se$_5$, that is, partially substituting In with Ga.

Example 4

Example 4 illustrates the introduction of Cd after layering a compound semiconductor layer including elements of the groups Ib, IIIb, and VIb at a proportion of 1:3:5 onto a compound semiconductor layer including elements of the groups Ib, IIIb, and VIb at a proportion of 1:1:2.

A CuInSe$_2$ layer of about 2 μm thickness was formed on a glass substrate by vapor deposition, and a CuIn$_3$Se$_5$ layer of about 10 nm was formed on the CuInSe$_2$ layer.

Then, an aqueous solution comprising cadmium acetate (Cd(CH$_3$COO)$_2$), which is a compound (salt) containing cadmium, and ammonia was prepared. The concentration of cadmium acetate in the solution was 0.001 mol/l, and the concentration of ammonia was 1 mol/l. The container holding the solution was kept in a bath maintained at a constant temperature of 85° C. The glass substrate was immersed in the solution for about 6 min. Then, the glass substrate was retrieved and rinsed with aqua pura.

Figure 16:
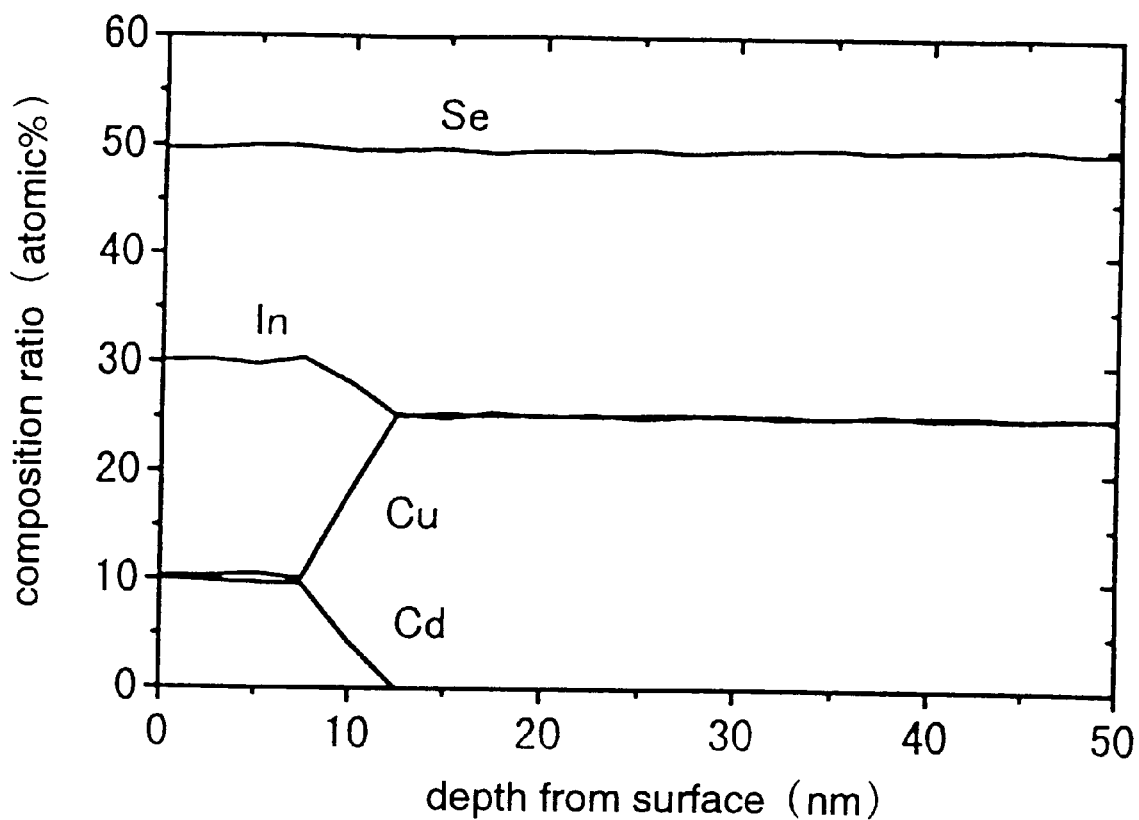
FIG. 16 is a graph showing the results of an Auger electron spectroscopic analysis for yet another semiconductor thin film of the present invention.

As above, the composition of the treated film depending on the film depth was measured by Auger electron spectroscopic analysis. The result of the measurement is shown in FIG. 16. The abscissa of FIG. 16 marks the depth from the surface. As is shown in FIG. 16, Cd could be detected in the CuIn$_3$Se$_5$ portion, but Cd was hardly detected in the CuInSe$_2$ layer. This is because Cd is easy to introduce into CuIn$_3$Se$_5$ and difficult to introduce into CuInSe$_2$, as was already explained in Example 3.

Thus, making use of the difference in how easily Cd can be introduced into a semiconductor thin film including a CuInSe$_2$ layer and an adjacent CuIn$_3$Se$_5$ layer, Cd can be introduced basically only in the CuIn$_3$Se$_5$ layer.

This example related to CuIn$_3$Se$_5$ and CuInSe$_2$, but the same results were obtained with Cu(In, Ga)$_3$Se$_5$ and Cu(In, Ga)Se$_2$, that is, partially substituting In with Ga.

Example 5

Example 5 illustrates a method for manufacturing a compound semiconductor layer comprising elements of the groups Ib, IIIb, and VIb at a proportion of 1:3:5, and further comprising Zn.

First, an Mo film was formed on a glass substrate by sputtering, and a $CuIn_3Se_5$ film was formed on the Mo film.

Then, an aqueous solution containing zinc sulfate ($ZnSO_4$), which is a compound (salt) containing zinc, and ammonium was prepared. The concentration of zinc sulfate in the solution was 0.01 mol/l, and the concentration of ammonia was 1 mol/l. The container holding the solution was kept in a bath maintained at a constant temperature of 85° C. The glass substrate with the $CuIn_3Se_5$ film was immersed in the solution for about 20 min. Then, the glass substrate was retrieved and rinsed with aqua pura. After this treatment, the substrate was heat-treated in a nitrogen atmosphere of 250° C. for 30 min.

Figure 17:
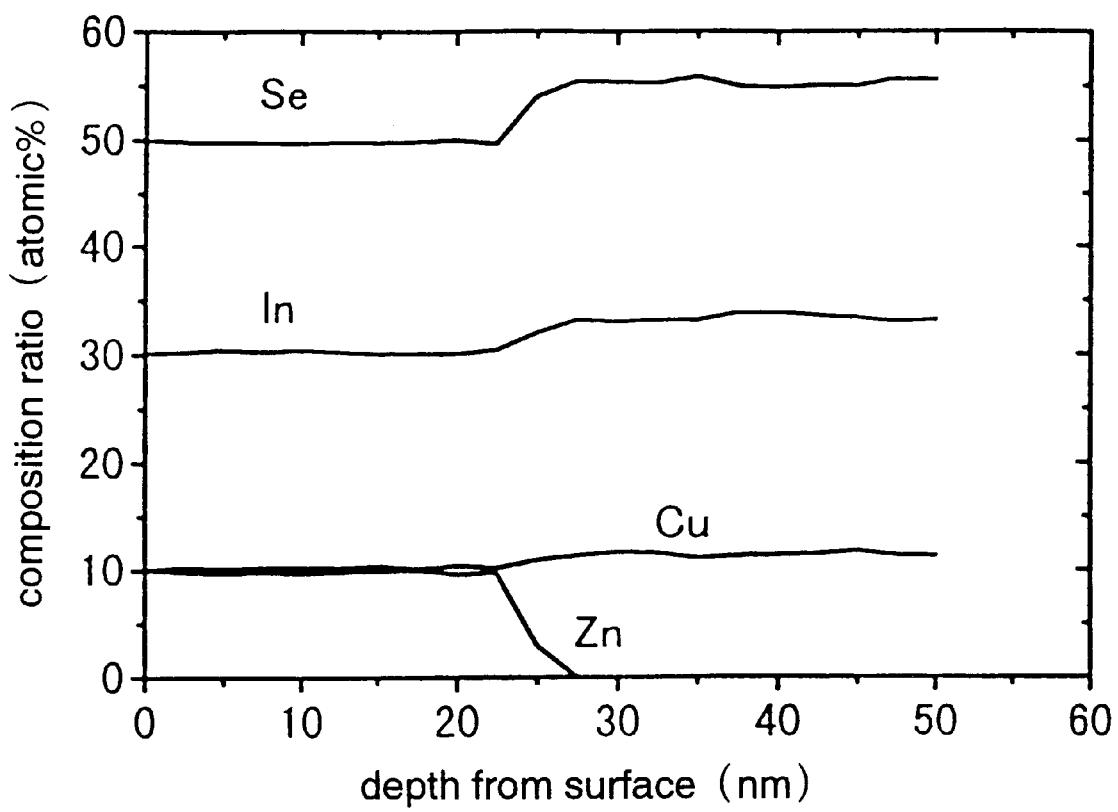
FIG. 17 is a graph showing the results of an Auger electron spectroscopic analysis for yet another semiconductor thin film of the present invention.
Figure 18:
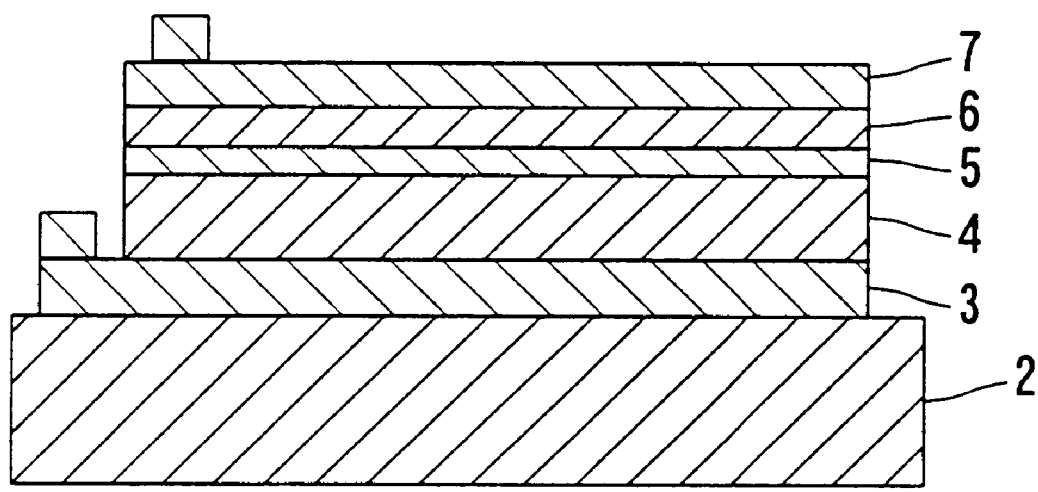
FIG. 18 is a cross-sectional view of a conventional solar cell.

As above, the composition of the $CuIn_3Se_5$ film depending on the film depth was measured by Auger electron spectroscopic analysis. The result of the measurement is shown in FIG. 17. The abscissa of FIG. 17 marks the depth from the surface. As is shown in FIG. 17, Zn could be detected to a depth of 30 nm from the surface. Thus, it was verified that the $CuIn_3Se_5$ film contained Zn after being immersed in the solution.

Thus, Zn could be introduced easily into the $CuIn_3Se_5$ film. In this example, a sulfate was used for the Zn salt, but the same results were attained when using, for example, a chloride, an iodide, a bromide, a nitrate, or an acetate.

This example related to $CuIn_3Se_5$, but the same results were obtained with $Cu(In, Ga)_3Se_5$, that is, partially substituting In with Ga.

Example 6

This example illustrates a method for manufacturing a solar cell including a semiconductor layer as described in Example 4 (i.e., a compound semiconductor layer comprising a $Cu(In, Ga)Se_2$ layer and a $Cu(In, Ga)_3Se_5$ film into which Cd was introduced)

FIG. 7 illustrates the solar cell of Example 6.

In this example, a Mo film (of 1 μm thickness), serving as the rear electrode 72, was formed on a glass substrate serving as the substrate 71. A $Cu(In, Ga)Se_2$ film (of 2 μm thickness), serving as the p-type compound semiconductor layer 13, and a $Cu(In, Ga)_3Se_5$ film (of 10 nm thickness), serving as the n-type compound semiconductor layer 12, were formed thereon by vapor deposition. Then, the substrate 71 with the n-type compound semiconductor layer 12 was contacted with a solution containing a Cd compound as the solute, under the same conditions as in Example 4.

After this, the compound semiconductor layer was heat-treated in a nitrogen atmosphere at 250° C. for 30min.

After the heat-treatment, a Zn(O, OH, S) film (of 30 nm thickness), serving as the n-type semiconductor layer 14, was formed by chemical bath deposition. To form the n-type semiconductor layer 14, a solution was prepared by mixing zinc acetate ($Zn(CH_3COO)_2$), thiourea ($NH_2CSNH_2$), and aqueous ammonia. The container holding the solution was kept in a bath maintained at a constant temperature of 85° C. After the heat-treated substrate was immersed into the solution for about 20 min, it was retrieved and rinsed with aqua pura. Thus, an n-type semiconductor layer was formed.

Moreover, a ZnO film (of 100 nm thickness), serving as the window layer 76, and an ITO film (of 100 nm thickness), serving as the transparent conductive layer 77, were formed on the n-type semiconductor layer 14 by sputtering (Ar gas, $8 \times 10^{-3}$ Torr, 500 W high-frequency power). Then, a p-side electrode 78 (of 350 nm thickness) and an n-type electrode 79 (of 350 nm thickness) were formed. The p-side electrode 78 and the n-side electrode 79 were formed layering a NiCr film and an Au film by electron beam vapor deposition.

As a comparative example, a solar cell was manufactured without the treatment with a solution containing Cd.

The characteristics of the resulting solar cells were measured by irradiating them with AM (air mass) 1.5, 100 mW/cm² artificial sunlight.

When the characteristics of the these solar cells were examined, the solar cell that has been treated with a solution containing Cd had an open circuit voltage and a short-circuit current that were about 1.1 times higher, and a fill factor that was about 1.4 times than that of the solar cell that has not been treated with a solution containing Cd. As a result, its conversion efficiency was about 1.7 times higher.

According to this example, the pn-junction of this solar cell was formed by a p-type $Cu(In, Ga)Se_2$ film and an n-type $Cu(In, Ga)_3Se_5$ film, so that there were few defects at the junction interface, and a solar cell with high conversion efficiency could be obtained.

Example 7

This example illustrates a method for manufacturing a solar cell, including Mg into the $Cu(In, Ga)_3Se_5$ film with the method described in the fourth embodiment.

In this example, a Mo film, a $Cu(In, Ga)Se_2$ film, and a $Cu(In, Ga)_3Se_5$ film were formed on a glass substrate by vapor deposition. A Mg thin film was formed on top of the $Cu(In, Ga)_3Se_5$ film by vapor deposition. The $Cu(In, Ga)_3Se_5$ film with the Mg thin film was heated for one hour in an argon atmosphere of 250° C. to thermally diffuse the Mg.

After the thermal diffusion, the composition of the $Cu(In, Ga)_3Se_5$ film was analyzed by Auger electron spectroscopic analysis, and it was ascertained that Mg was uniformly introduced into the $Cu(In, Ga)_3Se_5$ film.

Then, a solar cell was manufactured by the same method as in Example 6, and upon evaluation it was determined that this solar cell showed the substantially same characteristics as the one in Example 6.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor thin film comprising an n-type compound semiconductor layer including at least one element from each of groups Ib, IIb, VIb and II, wherein the proportion of the elements of group Ib, group IIIb and group VIb respectively in the n-type compound semiconductor layer is X:Y:Z, wherein $0.05 \leq X \leq 0.2$; $0.25 \leq Y \leq 0.4$; and $0.45 \leq Z \leq 0.65$.

2. The semiconductor thin film according to claim 1, further comprising a p-type compound semiconductor layer adjacent to said n-type compound semiconductor layer, the p-type compound semiconductor layer including at least one element from each of groups Ib, IIIb, and VIb.

3. The semiconductor thin film according to claim 2, wherein, in each of the n-type compound semiconductor layer and the p-type compound semiconductor layer, the group Ib element consists of Cu, the group IIIb element includes at least one element selected from the group consisting of In and Ga, and the group VIb element includes at least one element selected from the group consisting of Se and S.

4. The semiconductor thin film according to claim 3, wherein, in the n-type compound semiconductor layer, the group II element includes at least one element selected from the group consisting of Mg, Zn and Cd.

5. The semiconductor thin film according to claim 1, wherein the n-type compound semiconductor layer is formed by contacting a compound semiconductor layer comprising at least one element from each of groups Ib, IIIb, and VIb with a solution that comprises ions of the group II element.

6. The semiconductor thin film according to claim 2, wherein the proportion of the elements of group Ib, group IIIb, and group VIb, respectively in said p-type compound semiconductor layer is U:V:W, wherein $0.15 \leq U \leq 0.35$; $0.15 \leq V \leq 0.35$; and $0.4 \leq W \leq 0.6$.

7. The semiconductor thin film according to claim 2, further comprising an n-type semiconductor layer formed on said n-type compound semiconductor layer.

8. The semiconductor thin film according to claim 7, wherein said n-type semiconductor layer comprises at least one semiconductor selected from the group consisting of ZnO, Zn(O, OH), and Zn(O, OH, S).

9. A method for manufacturing a semiconductor thin film comprising:

(a) forming a first compound semiconductor layer including at least one element from each of groups Ib, IIIb, and VIb; and (b) forming an n-type compound semiconductor layer including at least one element from each of groups Ib, IIIb, VIb and II by introducing a group II element into said first compound semiconductor layer, wherein the proportion of the elements of group Ib, group IIIb, and group VIb respectively in the first compound semiconductor layer is X:Y:Z, with $0.05 \leq X \leq 0.2$; $0.25 \leq Y \leq 0.4$; and $0.45 \leq Z \leq 0.65$.

10. The method according to claim 9, wherein the group Ib element consists of Cu, the group IIIb element includes at least one element selected from the group consisting of In and Ga, and the group VIb element includes at least one element selected from the group consisting of Se and S.

11. The method according to claim 9, wherein said group II element includes at least one element selected from the group consisting of Mg, Zn and Cd.

12. The method according to claim 9, wherein step (a) comprises:

forming a p-type compound semiconductor layer including at least one element from each of the groups Ib, IIIb, and VIb; and forming said first compound semiconductor layer on said p-type compound semiconductor layer.

13. The method according to claim 12, wherein the proportion of the elements of group Ib, group IIIb, and group VIb, respectively, in said p-type compound semiconductor layer is U:V:W, with $0.15 \leq U \leq 0.35$; $0.15 \leq V \leq 0.35$; and $0.4 \leq W \leq 0.6$.

14. The method according to claim 9, farther comprising:

(c) forming an n-type semiconductor layer on said n-type compound semiconductor layer.

15. The method according to claim 14, wherein said n-type semiconductor layer comprises at least one semiconductor selected from the group consisting of ZnO, Zn(O, OH), and Zn(O, OH, S).

16. The method according to claim 9, where in step (b), the group II element is introduced into said first compound semiconductor layer by contacting said first compound semiconductor layer with a solution that comprises ions of the group II element.

17. The method according to claim 16, wherein said solution comprises at least one solute selected from the group consisting of the halides, acetates, nitrates and sulfates of group II elements.

18. The method according to claim 16, wherein said solution further comprises ammonia.

19. The method according to claim 16, wherein the temperature of said solution is 10° C. to 100° C.

20. The method according to claim 16, wherein the pH-value of said solution is 10 to 12.

21. The method according to claim 16, further comprising:

(d) heating said n-type compound semiconductor layer after step (b).

22. The method according to claim 21, wherein step (d) is performed either in a gas atmosphere consisting of at least one gas selected from the group consisting of nitrogen, hydrogen sulfide, and argon, or in a vacuum.

23. The method according to claim 21, wherein step (d) is performed at a temperature of 100° C. to 600° C.

24. The method according to claim 9, wherein step (b) is performed by thermal diffusion of the group II element after forming a metal thin film made of the group II element on said first compound semiconductor layer.

25. A method for manufacturing a semiconductor thin film comprising:

forming an n-type compound semiconductor layer including at least one element from each of groups Ib, IIIb, VIb and II by simultaneously depositing the at least one element from each of groups Ib, IIIb, VIb and II on a substrate to form a semiconductor thin film wherein the proportion of the elements of group Ib, group IIIb, and group VIb respectively in the n-type compound semiconductor layer is X:Y:Z, wherein $0.05 \leq X \leq 0.2$; $0.25 \leq Y \leq 0.4$: and $0.45 \leq Z \leq 0.65$.

26. The method according to claim 25, wherein the at least one element from each of groups Ib, IIIb, VIb and II are deposited by at least one method selected from vapor deposition and sputtering.

27. The method according to claim 25, wherein the at least one group Ib element consists of Cu, the at least one group IIIb element includes at least one element selected from the group consisting of In and Ga, and the at least one group VIb element includes at least one element selected from the group consisting of Se and S.

28. The method according to claim 25, wherein the at least one group II element includes at least one element selected from the group consisting of Mg, Zn and Cd.

29. A solar cell comprising the semiconductor thin film according to any one of claims 1 to 4 or 6 to 8.

* * * * *